(12) United States Patent
Hartmann-Thompson et al.

(10) Patent No.: US 11,034,843 B2
(45) Date of Patent: Jun. 15, 2021

(54) FLEXIBLE NANOPARTICLE OPTICAL COATING COMPOSITIONS

(71) Applicant: 3M INNOVATIVE PROPERTIES COMPANY, St. Paul, MN (US)

(72) Inventors: Claire Hartmann-Thompson, Lake Elmo, MN (US); Jonathan A. Anim-Addo, New Hope, MN (US); Justin P. Meyer, Oakdale, MN (US); Samuel J. Carpenter, Shoreview, MN (US); Bryan V. Hunt, Anoka, MN (US)

(73) Assignee: 3M INNOVATIVE PROPERTIES COMPANY, St. Paul, MN (US)

( * ) Notice: Subject to any disclaimer, the term of this patent is extended or adjusted under 35 U.S.C. 154(b) by 63 days.

(21) Appl. No.: 16/473,910

(22) PCT Filed: Dec. 27, 2017

(86) PCT No.: PCT/IB2017/058442
§ 371 (c)(1),
(2) Date: Jun. 26, 2019

(87) PCT Pub. No.: WO2018/122749
PCT Pub. Date: Jul. 5, 2018

(65) Prior Publication Data
US 2019/0338142 A1  Nov. 7, 2019

Related U.S. Application Data

(60) Provisional application No. 62/439,981, filed on Dec. 29, 2016.

(51) Int. Cl.
*C09D 4/00* (2006.01)
*C08F 220/18* (2006.01)
(Continued)

(52) U.S. Cl.
CPC .............. *C09D 4/00* (2013.01); *C08F 220/18* (2013.01); *C08K 3/22* (2013.01); *C08K 9/06* (2013.01);
(Continued)

(58) Field of Classification Search
CPC ....................................................... C09D 4/00
See application file for complete search history.

(56) References Cited

U.S. PATENT DOCUMENTS 2,736,721 A   2/1956 Dexter
5,214,119 A   5/1993 Leir
(Continued)

FOREIGN PATENT DOCUMENTS

WO   WO 2010-051229    5/2010

OTHER PUBLICATIONS

Smith, Modern Optical Engineering: The Design of Optical Systems, McGraw-Hill Book Company, 1966, pp. 104-105.
(Continued)

*Primary Examiner* — Arrie L Reuther
(74) *Attorney, Agent, or Firm* — Jeffrey M. Olofson

(57) ABSTRACT

Curable, coatable compositions include silane surface-treated inorganic nanoparticles with a high refractive index, and a curable reaction mixture. The curable reaction mixture includes a first (meth)acrylate monomer comprising a high refractive index (meth)acrylate monomer with a refractive index of 1.6 or higher, a second (meth)acrylate monomer comprising a lower refractive index (meth)acrylate monomer with a refractive index of less than 1.6, and at least one initiator. Cured optical coatings prepared from the compositions are optically clear, having a visible light transmission of at least 88% and a haze of 5% or less, and have a refractive index of at least 1.78, and are capable of passing a 10 millimeter mandrel flexibility test.

20 Claims, 1 Drawing Sheet

(51) Int. Cl.
*C08K 3/22* (2006.01)
*C08K 9/06* (2006.01)
*H01L 51/52* (2006.01)

(52) U.S. Cl.
CPC ...... *H01L 51/5253* (2013.01); *H01L 51/5275* (2013.01); *C08F 220/1818* (2020.02); *C08K 2003/2237* (2013.01); *C08K 2003/2244* (2013.01); *C08K 2201/011* (2013.01)

(56) References Cited

U.S. PATENT DOCUMENTS

| | | |
|---|---|---|
| 7,371,464 B2 | 5/2008 | Sherman |
| 7,981,995 B2 | 7/2011 | Hays |
| 8,012,567 B2 | 9/2011 | Gaides |
| 8,530,572 B2 | 9/2013 | Kolb |
| 8,659,221 B2 | 2/2014 | Jones |
| 2006/0147702 A1 | 7/2006 | Pokorny |
| 2010/0003501 A1 | 1/2010 | Liu |
| 2011/0086972 A1 | 4/2011 | Hunt |
| 2011/0123800 A1 | 5/2011 | Sherman |
| 2013/0241092 A1 | 9/2013 | Takeuchi |
| 2013/0323467 A1 | 12/2013 | Jones |
| 2014/0370307 A1 | 12/2014 | Hao |

OTHER PUBLICATIONS

International Search Report for PCT International Application No. PCT/IB2017/058442, dated Apr. 12, 2018, 5 pages.

FLEXIBLE NANOPARTICLE OPTICAL COATING COMPOSITIONS

FIELD OF THE DISCLOSURE

The present disclosure relates to curable coating compositions useful to prepare optical coatings that are flexible and have a high refractive index, and to articles and devices that include such coating compositions.

BACKGROUND

Increasingly, optical devices are becoming more complicated and involve more and more functional layers. As light travels through the layers of the optical device, the light can be altered by the layers in a wide variety of ways. For example, light can be reflected, refracted or absorbed. In many cases, layers that are included in optical devices for non-optical reasons adversely affect the optical properties. For example, if a support layer is included that is not optically clear, the absorption of light by the non-optically support layer can adversely affect the light transmission of the entire device.

One common difficulty with multi-layer optical devices is that when layers of differing refractive indices are adjacent to each other, refraction of light can occur at their interface. In some devices this refraction of light is desirable, but in other devices the refraction is undesirable. In order to minimize of eliminate this refraction of light at the interface between two layers, efforts have been made to minimize the difference in refractive index between the two layers that form the interface. However, as a wider range of materials are employed within optical devices, the matching of refractive indices can become increasingly difficult. Organic polymer films and coatings, which are frequently used in optical devices, have a limited range of refractive indices. As higher refractive index materials are increasingly used in optical devices, it has become increasingly difficult to prepare organic polymeric compositions which have suitable refractive indices and yet retain the desirable features of organic polymers, features such as ease of processing, flexibility, and the like.

SUMMARY

Disclosed herein are curable, coatable compositions, articles prepared with these curable, coatable compositions, devices incorporating the curable, coatable compositions, and methods of preparing optical articles.

In some embodiments, the curable, coatable composition comprises surface-treated inorganic nanoparticles with a high refractive index, where the surface-treated inorganic nanoparticles have been treated with a surface treatment agent comprising a silane surface treatment agent, and a curable reaction mixture. The curable reaction mixture comprises a first (meth)acrylate monomer comprising a high refractive index (meth)acrylate monomer with a refractive index of 1.6 or higher, a second (meth)acrylate monomer comprising a lower refractive index (meth)acrylate monomer with a refractive index of less than 1.6, and at least one initiator.

Also disclosed are articles, the articles comprising a first substrate with a first major surface and a second major surface, and a cured or curable optical coating layer adjacent to at least a portion of the second major surface of the first substrate, wherein the cured or curable optical coating layer is prepared from a curable, coatable composition that has been coated and optionally cured. The curable, coatable composition comprises surface-treated inorganic nanoparticles with a high refractive index, where the surface-treated inorganic nanoparticles have been treated with a surface treatment agent comprising a silane surface treatment agent, and a curable reaction mixture. The curable reaction mixture comprises a first (meth)acrylate monomer comprising a high refractive index (meth)acrylate monomer with a refractive index of 1.6 or higher, a second (meth)acrylate monomer comprising a lower refractive index (meth)acrylate monomer with a refractive index of less than 1.6, and at least one initiator.

Also disclosed are devices that comprise multilayer optical articles. In some embodiments, the device comprises a device surface with a multilayer optical article attached to the device surface, where the multilayer optical article comprises an adhesive layer in contact with the device surface, and a cured optical coating layer contacting the adhesive layer, where the cured optical coating layer is prepared from a curable, coatable composition that has been coated and cured. The curable, coatable composition comprises surface-treated inorganic nanoparticles with a high refractive index, where the surface-treated inorganic nanoparticles have been treated with a surface treatment agent comprising a silane surface treatment agent, and a curable reaction mixture. The curable reaction mixture comprises a first (meth)acrylate monomer comprising a high refractive index (meth)acrylate monomer with a refractive index of 1.6 or higher, a second (meth)acrylate monomer comprising a lower refractive index (meth)acrylate monomer with a refractive index of less than 1.6, and at least one initiator. The cured optical coating layer is optically clear, has a visible light transmission of at least 88% and a haze of 5% or less, it has a refractive index of at least 1.78, and is capable of passing a 10 millimeter mandrel flexibility test.

Also disclosed are methods of preparing optical articles. In some embodiments, the method comprises providing a first substrate with a first major surface and a second major surface, providing a curable, coatable composition, coating the curable, coatable composition on at least a portion of the second major surface of the first substrate to form an optical coating layer adjacent to the second major surface of the first substrate, and curing the optical coating layer. The curable, coatable composition comprises surface-treated inorganic nanoparticles with a high refractive index, where the surface-treated inorganic nanoparticles have been treated with a surface treatment agent comprising a silane surface treatment agent, and a curable reaction mixture. The curable reaction mixture comprises a first (meth)acrylate monomer comprising a high refractive index (meth)acrylate monomer with a refractive index of 1.6 or higher, a second (meth)acrylate monomer comprising a lower refractive index (meth)acrylate monomer with a refractive index of less than 1.6, and at least one initiator.

BRIEF DESCRIPTION OF THE DRAWINGS

The present application may be more completely understood in consideration of the following detailed description of various embodiments of the disclosure in connection with the accompanying drawings.

Figure 1:
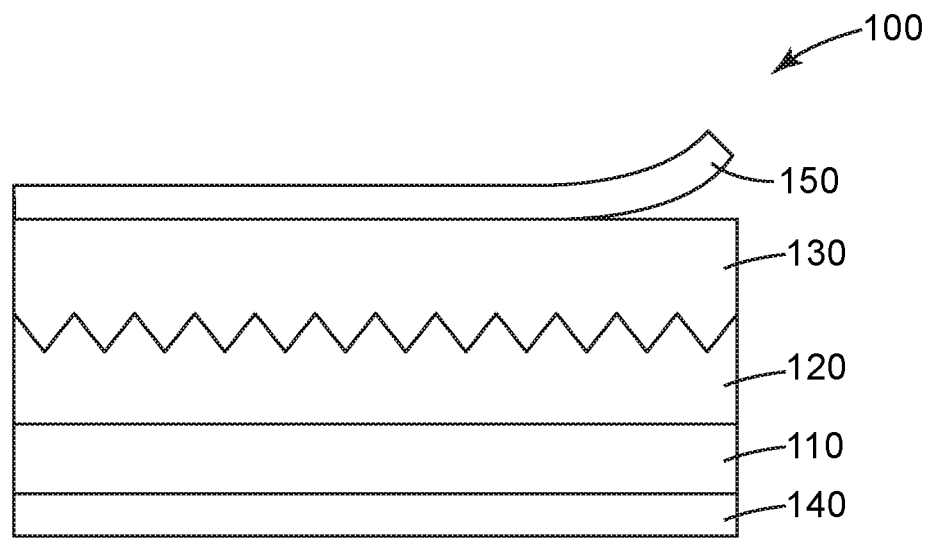
FIG. 1 shows a cross-sectional views of an embodiment of an article of this disclosure.

In the following description of the illustrated embodiments, reference is made to the accompanying drawings, in which is shown by way of illustration, various embodiments in which the disclosure may be practiced. It is to be understood that the embodiments may be utilized and structural changes may be made without departing from the scope of the present disclosure. The figures are not necessarily to scale. Like numbers used in the figures refer to like components. However, it will be understood that the use of a number to refer to a component in a given figure is not intended to limit the component in another figure labeled with the same number.

DETAILED DESCRIPTION

A wide range of optical layers are required for a wide variety of applications and devices. These optical layers can include films and coatings, and often include combinations of films and coatings. An example of applications and devices that utilize optical layers are OLED devices. OLED devices are Organic Light Emitting Diode devices.

Many optical applications utilize multi-layer optical articles in their construction. These multi-layer articles can include optical films and optical coating layers. Coating layers are particularly useful in a wide range of optical applications. These coating layers are typically prepared by coating a curable coating composition onto a substrate and curing the coating composition. A wide range of coating compositions for use in optical applications have been prepared, such as for example optically clear hardcoats to protect optical elements, optically clear adhesives to adhere together optical films, as well as a wide range of specialized coating layers.

Among the specialized coating layers desirable for use in optical applications are coating layers that have a high refractive index. The term high refractive index as used herein refers to materials that have a refractive index of at least 1.7. In particular, coating layers with a high refractive index are desirable.

Achieving a high refractive index in a coating layer is not a trivial matter. Typically coating layers are prepared from organic polymers, and organic polymers, and the monomers which are used to prepare them, have a refractive index that is too low for use in a high refractive index coating layer. Typically organic polymers have a refractive index in the range of 1.3-1.6. Specialized polymers with higher refractive indices have been developed, but such polymers tend to be expensive and it is generally not feasible to prepare high refractive index coating layers that include only organic polymers. Generally, inorganic nanoparticles that have a high refractive index are added to an organic polymeric to raise the refractive index of the overall coating layer. Often high levels of the inorganic nanoparticles are required to achieve a high refractive index.

Coating layers that include high refractive index nanoparticles dispersed in an organic polymeric matrix have been used in a variety of optical applications. For example in US Patent Publication No. 2014/0370307 (Hao et al.) high refractive index nanoparticles are used to form optical coupling layers.

However, as the uses for high refractive index coating layers have increased, the requirements for these coating layers have become more stringent. One feature that is becoming increasing important for these coating layers is flexibility. As used in this context, flexibility refers to the ability to bend without breaking or cracking. Because high refractive index coating layers contain high levels of rigid inorganic nanoparticles, they tend to be brittle and lack flexibility.

In this disclosure, coating compositions are described that are capable of forming coating layers that not only have the desirable optical properties of high refractive index, high visible light transmission, and low haze, but also are flexible. As will be described in detail below and in the Examples section, flexibility of coating layers can be measured by mandrel bend testing. Thus the coating compositions of the present disclosure are curable coating compositions, meaning that the coating compositions can be coated and cured to form a coating layer. The coating layers thus formed can be continuous or discontinuous.

Therefore the curable, coatable compositions of this disclosure have a wide range of properties, where many of these properties are counter to each other and require balancing of properties. For example, the curable, coatable compositions are coatable, meaning that they are capable of being coated. This requires a balancing of the amount of inorganic nanoparticles that can be included relative to the amount of curable organic monomers. In order to achieve a coatable composition, one desires to have sufficiently high level of curable organic monomers. This balance is further complicated by the need to have a high refractive index. Since the inorganic nanoparticles raise the refractive index and the organic polymer lowers the refractive index of the coating layer, in order to achieve a high refractive index one wants to have as high a level of inorganic nanoparticles as possible.

To achieve the balance of desired properties, the curable, coatable compositions of this disclosure use a mixture of two different (meth)acrylate-based monomers. The mixture of (meth)acrylate-based monomers includes a first (meth)acrylate monomer comprising a high refractive index (meth)acrylate monomer with a refractive index of 1.6 or higher, and a second (meth)acrylate monomer comprising a lower refractive index (meth)acrylate monomer with a refractive index of less than 1.6 that helps to provide enhanced flexibility to the cured composition. Each of these monomers will be described in greater detail below.

Thus the coating compositions of the present disclosure unexpectedly provide the often contrary range of properties of being coatable, combined with the properties upon curing of desirable optical performance (visible light transmission of at least 90%, haze of less than 5%, and a high refractive index of greater than 1.7) and flexibility (as tested by mandrel bend testing).

Also disclosed herein are articles prepared from optical coatings prepared from the curable, coatable compositions of this disclosure, devices that include multi-layer articles that include optical coatings prepared from the curable, coatable compositions of this disclosure, and methods of preparing optical articles that include optical coatings prepared from the curable, coatable compositions of this disclosure. All of these articles and methods are described in greater detail below.

Unless otherwise indicated, all numbers expressing feature sizes, amounts, and physical properties used in the specification and claims are to be understood as being modified in all instances by the term "about." Accordingly, unless indicated to the contrary, the numerical parameters set forth in the foregoing specification and attached claims are approximations that can vary depending upon the desired properties sought to be obtained by those skilled in the art utilizing the teachings disclosed herein. The recitation of numerical ranges by endpoints includes all numbers subsumed within that range (e.g. 1 to 5 includes 1, 1.5, 2, 2.75, 3, 3.80, 4, and 5) and any range within that range.

As used in this specification and the appended claims, the singular forms "a", "an", and "the" encompass embodiments having plural referents, unless the content clearly dictates otherwise. For example, reference to "a layer" encompasses embodiments having one, two or more layers. As used in this specification and the appended claims, the term "or" is generally employed in its sense including "and/or" unless the content clearly dictates otherwise.

The terms "backfill materials" or "backfill layers" as used herein refer to layers of materials that fill in irregular or structured surfaces to produce a new surface that may be used as a base to build additional layered elements and is thermally stable.

The term "nanostructures" as used herein, refers to features that range from about 1 nanometer to about 1000 micrometers in their longest dimension and includes microstructures.

The term "structured surface" as used herein, refers to a surface that includes nanostructures that can be in a regular pattern or random across the surface. As used herein, a "microstructured material" refers to a material that includes at least one surface having one or more microscopic features.

As used herein, a "microstructured" surface means that the surface has a configuration of features in which at least 2 dimensions of the features are microscopic. As used herein, the term "microscopic" refers to features of small enough dimension so as to require an optic aid to the naked eye when viewed from a plane of view to determine its shape. One criterion is found in *Modern Optical Engineering* by W. J. Smith, McGraw-Hill, 1966, pages 104-105 whereby visual acuity "is defined and measured in terms of the angular size of the smallest character that can be recognized." Normal visual acuity is considered to be when the smallest recognizable letter subtends an angular height of 5 minutes of arc on the retina. At a typical working distance of 250 mm (10 inches), this yields a lateral dimension of 0.36 mm (0.0145 inch) for this object.

The terms "setting", "curing", and "reacting" are used interchangeably to describe the reaction or polymerization of reactive groups in a reactive composition to form a polymeric composition that is no longer reactive. The setting, curing, or reacting may or may not involve crosslinking.

The terms "room temperature" and "ambient temperature" are used interchangeably to mean temperatures in the range of 20° C. to 25° C.

The terms "Tg" and "glass transition temperature" are used interchangeably. If measured, Tg values are determined by Differential Scanning calorimetry (DSC) at a scan rate of 10° C./minute, unless otherwise indicated. Typically, Tg values for copolymers are not measured but are calculated using the well-known Fox Equation, using the monomer Tg values provided by the monomer supplier for homopolymers, as is understood by one of skill in the art The term "hydrocarbon group" as used herein refers to any monovalent group that contains primarily or exclusively carbon and hydrogen atoms. Alkyl and aryl groups are examples of hydrocarbon groups.

The term "hydrocarbon-based layer" refers to a layer that primarily comprises carbon and hydrogen and may also contain heteroatoms or heteroatom groups such as silicon, oxygen, nitrogen, sulfur, etc atoms, (meth)acrylate groups, silicone groups, and the like.

The term "adjacent" as used herein when referring to two layers means that the two layers are in proximity with one another with no intervening open space between them. They may be in direct contact with one another (e.g. laminated together) or there may be intervening layers.

The term "alkyl" refers to a monovalent group that is a radical of an alkane, which is a saturated hydrocarbon. The alkyl can be linear, branched, cyclic, or combinations thereof and typically has 1 to 20 carbon atoms. In some embodiments, the alkyl group contains 1 to 18, 1 to 12, 1 to 10, 1 to 8, 1 to 6, or 1 to 4 carbon atoms. Examples of alkyl groups include, but are not limited to, methyl, ethyl, n-propyl, isopropyl, n-butyl, isobutyl, tert-butyl, n-pentyl, n-hexyl, cyclohexyl, n-heptyl, n-octyl, and ethylhexyl.

The term "aryl" refers to a monovalent group that is aromatic and carbocyclic. The aryl can have one to five rings that are connected to or fused to the aromatic ring. The other ring structures can be aromatic, non-aromatic, or combinations thereof. Examples of aryl groups include, but are not limited to, phenyl, biphenyl, terphenyl, anthryl, naphthyl, acenaphthyl, anthraquinonyl, phenanthryl, anthracenyl, pyrenyl, perylenyl, and fluorenyl.

The term "alkylene" refers to a divalent group that is a radical of an alkane. The alkylene can be straight-chained, branched, cyclic, or combinations thereof. The alkylene often has 1 to 20 carbon atoms. In some embodiments, the alkylene contains 1 to 18, 1 to 12, 1 to 10, 1 to 8, 1 to 6, or 1 to 4 carbon atoms. The radical centers of the alkylene can be on the same carbon atom (i.e., an alkylidene) or on different carbon atoms.

The term "heteroalkylene" refers to a divalent group that includes at least two alkylene groups connected by a thio, oxy, or —NR— where R is alkyl. The heteroalkylene can be linear, branched, cyclic, substituted with alkyl groups, or combinations thereof. Some heteroalkylenes are poloxyyalkylenes where the heteroatom is oxygen such as for example, —$CH_2CH_2(OCH_2CH_2)_xOCH_2CH_2$—.

The term "arylene" refers to a divalent group that is carbocyclic and aromatic. The group has one to five rings that are connected, fused, or combinations thereof. The other rings can be aromatic, non-aromatic, or combinations thereof. In some embodiments, the arylene group has up to 5 rings, up to 4 rings, up to 3 rings, up to 2 rings, or one aromatic ring. For example, the arylene group can be phenylene.

The term "heteroarylene" refers to a divalent group that is carbocyclic and aromatic and contains heteroatoms such as sulfur, oxygen, nitrogen or halogens such as fluorine, chlorine, bromine or iodine.

The term "aralkylene" refers to a divalent group of formula —$R^a$—$Ar^a$— where $R^a$ is an alkylene and $Ar^a$ is an arylene (i.e., an alkylene is bonded to an arylene).

The term "(meth)acrylate" refers to monomeric and oligomeric acrylic or methacrylic esters of alcohols. Acrylate and methacrylate monomers or oligomers are referred to collectively herein as "(meth)acrylates". Materials referred to as "(meth)acrylate functional" or "(meth)acrylate-based" are materials that contain one or more (meth)acrylate groups.

The terms "free radically polymerizable" and "ethylenically unsaturated" are used interchangeably and refer to a reactive group which contains a carbon-carbon double bond which is able to be polymerized via a free radical polymerization mechanism.

Unless otherwise indicated, "optically transparent" refers to an article, film or adhesive that has a high light transmittance over at least a portion of the visible light spectrum (about 400 to about 700 nm). Typically, optically transparent articles have a visible light transmittance of at least 90%. The term "transparent film" refers to a film having a thickness such that when the film is disposed on a substrate, an image (disposed on or adjacent to the substrate) is visible through the thickness of the transparent film. In many embodiments, a transparent film allows the image to be seen through the thickness of the film without substantial loss of image clarity. In some embodiments, the transparent film has a matte or glossy finish.

Unless otherwise indicated, "optically clear" refers to an adhesive or article that has a high light transmittance of at least 88% over at least a portion of the visible light spectrum (about 400 to about 700 nm), and that exhibits low haze, typically less than about 5%, or even less than about 2%. In some embodiments, optically clear articles exhibit a haze of less than 1% at a thickness of 50 micrometers or even 0.5% at a thickness of 50 micrometers. In some embodiments, optically clear articles have a visible light transmittance of at least 90%, often higher such as 95%, 97%, 98% or even 99% or higher. Optically clear articles or coatings are generally color neutral on the CIE Lab scale, with the a or b values being less than 0.5.

The term "releasing surface" as used herein refers to a surface that provides low adhesive strength to adhesives, especially pressure sensitive adhesives. Examples of releasing surfaces include the surfaces of release liners.

The term "release liners" as used herein refers to articles containing at least one release surface. When adhered to an adhesive layer, release liners adhere only lightly and are easily removed. A release liner may be a single layer (with only the base layer) or it may be a multilayer construction (with one or more coatings or additional layers in addition to the base layer). The release liner may also contain a structure or pattern such as a microstructure.

The term "adhesive" as used herein refers to polymeric compositions useful to adhere together two adherends. Examples of adhesives are heat activated adhesives, and pressure sensitive adhesives.

Heat activated adhesives are non-tacky at room temperature but become tacky and capable of bonding to a substrate at elevated temperatures. These adhesives usually have a Tg or melting point (Tm) above room temperature. When the temperature is elevated above the Tg or Tm, the storage modulus usually decreases and the adhesive become tacky.

Pressure sensitive adhesive compositions are well known to those of ordinary skill in the art to possess at room temperature properties including the following: (1) aggressive and permanent tack, (2) adherence with no more than finger pressure, (3) sufficient ability to hold onto an adherend, and (4) sufficient cohesive strength to be cleanly removable from the adherend. Materials that have been found to function well as PSAs are polymers designed and formulated to exhibit the requisite viscoelastic properties resulting in a desired balance of tack, peel adhesion, and shear holding power. Obtaining the proper balance of properties is not a simple process.

Disclosed herein are curable, coatable compositions, articles prepared from these curable, coatable compositions, devices that include the articles prepared from these curable, coatable compositions, and methods of preparing articles and devices.

Disclosed herein are coating compositions that are curable, coatable compositions comprising surface-treated inorganic nanoparticles with a high refractive index (typically 2.0 or greater), and a curable reaction mixture. The surface treatment agent of the surface-treated inorganic nanoparticles comprises a silane surface treatment agent. The curable reaction mixture comprises a first (meth)acrylate monomer comprising a high refractive index (meth)acrylate monomer with a refractive index of 1.6 or higher, a second (meth)acrylate monomer comprising a lower refractive index (meth)acrylate monomer with a refractive index of less than 1.6, and at least one initiator.

The curable, coatable compositions have a balance of properties as described above. The compositions are coatable, meaning that they are capable of being coated by conventional coating techniques and thus have a viscosity suitable for use with these coating techniques. The compositions are also curable, meaning that they contain a curable reaction mixture that can be cured to form a polymeric matrix that serves a binder matrix for the surface-treated inorganic nanoparticles. As will be described in greater detail below, the curable reaction mixture is formulated in such a way as to provide the desired properties of a high refractive index and desired flexibility when cured.

The curable, coatable compositions of this disclosure comprise inorganic nanoparticles with a high refractive index. In this context, a high refractive index refers to a refractive index of 2.0 or higher. These inorganic nanoparticles are surface-treated nanoparticles, which means that a surface treatment agent has been applied to the inorganic nanoparticles to at least partially modify the surface of the inorganic nanoparticles. The surface treatments are generally adsorbed or otherwise attached to the surface of the inorganic nanoparticles. An example of particularly suitable inorganic nanoparticles are metal oxide nanoparticles.

Surface modified (e.g. colloidal) nanoparticles can be present in the polymerized structure in an amount effective to enhance the refractive index of the coatable, curable compositions in which they are included. In some embodiments, the total amount of surface modified inorganic nanoparticles can be present in the coatable, curable compositions in an amount of at least 64% by weight. In some embodiments, the total amount of surface modified inorganic nanoparticles can be present in the coatable, curable compositions in an amount of at least 70% by weight. Such high levels of inorganic nanoparticles in the coatable, curable compositions may be expected to make a composition that is not only difficult to coat, but also upon curing one would not anticipate the cured composition to have the flexibility requisite for the applications desired. Thus the properties of the coatable, curable compositions of this disclosure are surprising and unexpected.

The size of such particles is chosen to avoid significant visible light scattering. It may be desirable to employ a mixture of inorganic oxide particle types to optimize an optical or material property and to lower total composition cost. The surface modified colloidal nanoparticles can be oxide particles having a (e.g. unassociated) primary particle size or associated particle size of greater than 1 nm, 5 nm or 10 nm. The primary or associated particle size is generally less than 100 nm, 75 nm, or 50 nm. Typically the primary or associated particle size is less than 40 nm, 30 nm, or 20 nm. It is preferred that the nanoparticles are unassociated. Their measurements can be based on transmission electron microscopy (TEM). As mentioned above, the nanoparticles can include metal oxides such as, for example, alumina, zirconia, titania, mixtures thereof, or mixed oxides thereof.

Zirconia and titania nanoparticles can have a particle size from 5 to 50 nm, or 5 to 15 nm, or 8 nm to 12 nm. Zirconias for use in composition and articles of this disclosure are available from Nalco Chemical Co. under the trade designation "Nalco OOSSOO8" and from Buhler AG Uzwil, Switzerland under the trade designation "Buhler zirconia Z-WO sol". Titania nanoparticles (nanoparticles of titanium dioxide) are particularly suitable. Titania nanoparticles of 10 nm are commercially available from Showa Denko Corp. of Japan as "NTB-1".

The nanoparticles are surface-treated to improve compatibility with the organic matrix material and to keep the nanoparticles non-associated, non-agglomerated, or a combination thereof in the coatable, curable composition. The surface treatment used to generate the surface-treated nanoparticles is a silane surface treatment agent.

Silane surface treatment agents are well known and readily available. A wide variety of silane surface treatment agents are suitable. In some embodiments more than one silane surface treatment agent can be used. The silane surface treatment agents are of the general structure: $R^aR^{-b}R^cSi-X$ where each $R^a$, $R^b$, $R^c$, is independently an alky or alkoxy group with the proviso that at least one of $R^a$, $R^b$, and $R^c$, is an alkoxy group with 1-3 carbon atoms. Many commercially available silane treatment agents have $R^a$, $R^b$, and $R^c$ as the same alkoxy group, typically methoxy or ethoxy. The X group is typically either a polyether group (an alkyl terminated heteroalkylene group) or a group that contains an ethylenically unsaturated group. Examples of polyether groups include polyethylene oxide ($-(O-CH_2-CH_2)_r-T$) and polypropylene oxide ($-(O-CH_2-CHMe)_r-T$) groups, where r is an integer of one or greater, and T is a terminal group, typically a hydrogen atom or an alkyl group. Examples of ethylenically unsaturated groups include (meth)acrylate groups. Often the X group is of the type -L-O(CO)—$R^dC=CH_2$, where L is an alkylene linking group, typically with 1-10 carbon atoms, (CO) is a carbonyl group, $R^d$ is a hydrogen atom (for acrylate groups) or a methyl group (for methacrylate groups).

As mentioned above, often it may be desirable that a combination of silane treatment agents are used. Among the suitable silane surface treatment agents are the commercially available surface treatment agents SILQUEST A-174NT (a (meth)acrylate-functional silane) and SILQUEST A-1230 (a polyether-functional silane) from Momentive Performance Materials Inc., Waterford, N.Y.

The curable, coatable composition also comprises a curable reaction mixture. This reaction mixture is a free radically polymerizable reaction mixture and comprises at least three elements: a first (meth)acrylate monomer with a high refractive index (which for the purposes of this disclosure includes (meth)acrylate monomers with a refractive index of 1.60 or higher); a second (meth)acrylate monomer with a lower refractive index (which for the purposes of this disclosure includes (meth)acrylate monomers with a refractive index of less than 1.60); and an initiator. Each of these elements may comprise a single material or may be a blend of more than one material. For example, the initiator can be a mixture of initiators, but more typically is a single initiator, or the first monomer can be a mixture of (meth)acrylate monomers as long as all of the first monomers have a refractive index of 1.60 or greater.

The curable reaction mixture serves as a binder for the surface-treated nanoparticles described above, and also provides the desired flexibility of the cured composition. As mentioned above, the components of the curable reaction mixture are chosen to balance the contradictory goals of having a high refractive index and desired flexibility. These goals are contradictory since the monomers that have a high refractive index tend to be more rigid and the monomers that give good flexibility tend to have a lower refractive index. The ability to balance these properties is part of the unexpected results of this disclosure.

Further, as stated above, the balance of high refractive index and desired flexibility of the cured curable reaction mixture is further complicated by the fact that a high loading of surface-treated inorganic nanoparticles are also present in the curable, coatable composition. The curable, coatable composition typically includes at least 64% by weight of the surface-treated inorganic nanoparticles, meaning that the curable, coatable composition typically includes no more than 36% by weight of the curable reaction mixture.

The monomers suitable for use in the curable reaction mixture are described in more detail below. For convenience, the amounts of curable materials present are described only in relation to the curable reaction mixture. The amount of curable materials present in the curable reaction mixture are presented in one of two ways. In some instances the % by weight of curable material relative to 100% of the curable reaction mixture is used, in other instances, such as in the Examples section, the ratio of monomers is described. For example a curable reaction mixture that comprises 50% by weight of Monomer A and 50% by weight of Monomer B can be described either as comprising 50% of Monomer A and 50% by weight of Monomer B, or may be described as a 1:1 ratio of Monomer A:Monomer B.

A variety of monomers are suitable for use as the first (meth)acrylate monomer with a high refractive index. In order to obtain a curable reaction mixture with the desired high refractive index and desired flexibility, typically the curable reaction mixture comprises at least one monofunctional aromatic (meth)acrylate with a refractive index of 1.60 or higher. A single monofunctional aromatic (meth)acrylate monomer may be used or a mixture of monofunctional aromatic (meth)acrylate monomers may be used. Generally, the at least one monofunctional aromatic (meth)acrylate comprises a compound of Formula I (shown below):

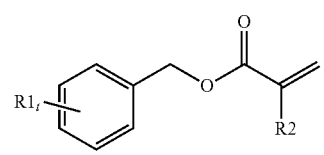

Formula I wherein at least one R1 comprises an aromatic substituent, t is an integer from 1 to 4, and R2 is hydrogen or methyl.

A wide variety of aromatic substituents are suitable for the R1 group or groups. Typically, the at least one aromatic substituent R1 comprises a substituted or unsubstituted aromatic group of the type —$CH_2$—Ar, or a heteroatom linked aromatic group of the type -X—Ar, where X is S or O, and each Ar is independently a substituted or unsubstituted phenyl group, a fused aromatic group, or 2 or more alkyl group-linked phenyl or substituted phenyl groups.

Thus the R1 group or groups may comprise various aromatic substituents such as:

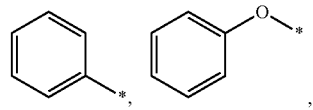

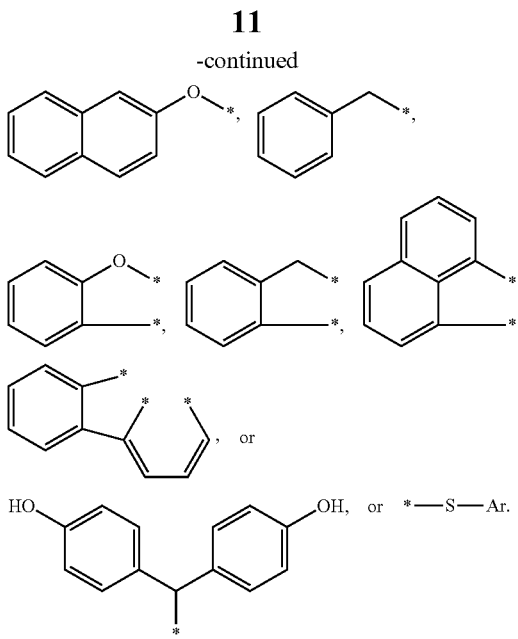

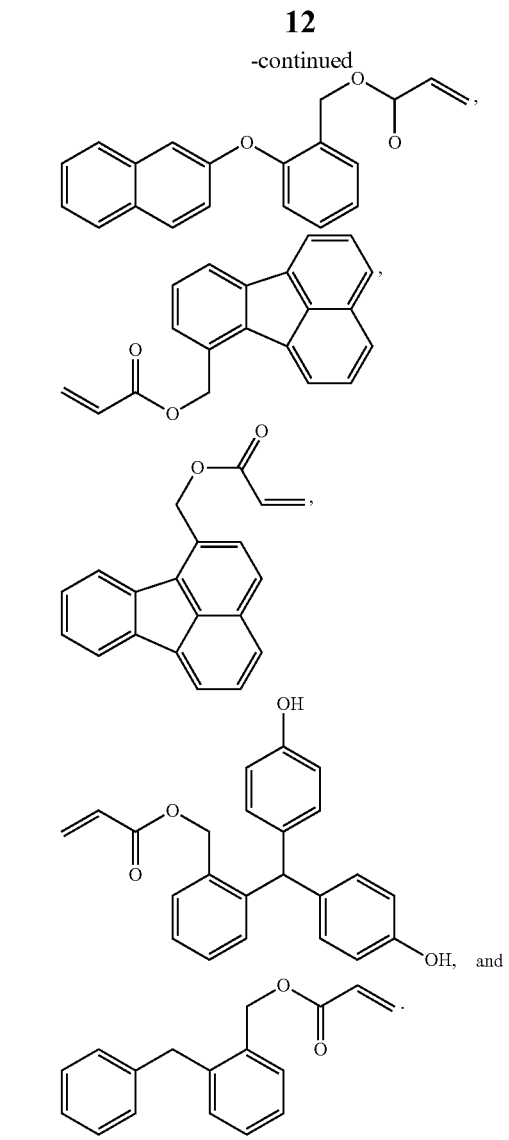

The aromatic substituent R1 is generally bonded to the aromatic ring of the benzyl group by at least one divalent (e.g. alkylene or ether) linking group. Hence, the aromatic ring of R1 is typically not fused to the aromatic benzyl ring, as in the case of naphthyl. In some embodiments, the aromatic substituent R1 is bonded to the aromatic benzyl ring by two or more divalent (e.g. alkylene or ether) linking groups. Each * denotes the point(s) of attachment to the aromatic ring of Formula I; and Ar is a substituted or unsubstituted phenyl group, a fused aromatic group, or 2 or more alkyl group-linked phenyl or substituted phenyl groups.

In some favored embodiments, t is 1. Representative structures for Formula I thus include:

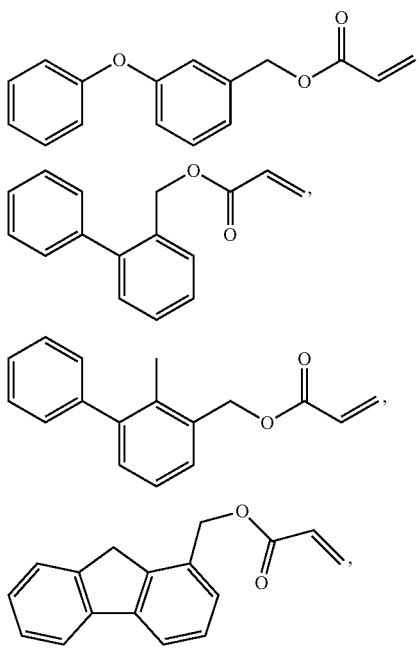

In some of the embodiments where t is 1 and the R1 group is *—S—Ar, the compounds can have the general structure of Formula IA:

Formula IA

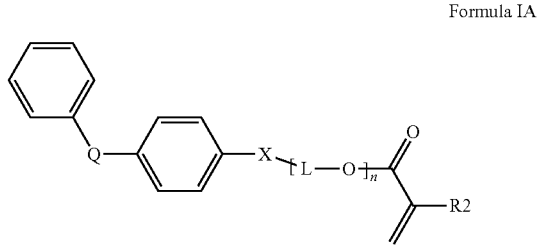

where R2 is H or CH$_3$, X is O, S, or a single bond, Q is O or S, n ranges from 0 to 10 (e.g. n is 0, 1, 2, 3, 4, 5, 6, 7, 8, 9, or 10), and L is an alkylene group having 1 to 5 carbon atoms, optionally substituted with hydroxyl groups. One particularly suitable monomer of Formula IA is one in which R2 is a hydrogen, n is 1, L is a —CH$_2$— group, X is a single bond, and Q is a sulfur.

In other embodiments, t is greater than 1. In one embodiment, t is 3. One representative structure is:

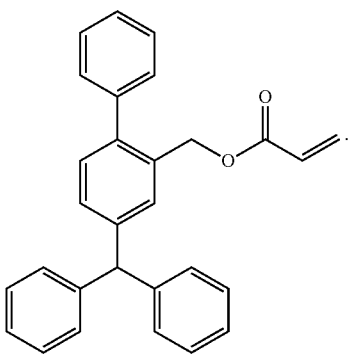 [SMILES: C=CC(=O)OCc1cc(C(c2ccccc2)c2ccccc2)ccc1-c1ccccc1]

Various aromatic alcohols from Sigma-Aldrich are available as starting materials that can be converted to (meth)acrylates by reacting such materials with (meth)acrylic acid or (meth)acrylic acid derivatives. Particularly suitable monofunctional aromatic (meth)acrylate monomers include biphenyl methyl acrylate (where R1 is phenyl group) commercially available from Miwon Specialty Chemicals, Exton, Pa. as MIRAMER M1192 or MIRAMER M1192H, and the monomer of Formula IA in which R2 is a hydrogen, n is 1, L is a —CH$_2$— group, X is single bond, and Q is a sulfur.

The amount of monofunctional aromatic (meth)acrylate monomer employed in the curable, coatable composition can vary. Typically the monofunctional aromatic (meth)acrylate monomer is in an amount of 25% by weight or more of the curable reaction mixture. By this it is meant that 25% by weight or greater of the curable reaction mixture is the monofunctional aromatic (meth)acrylate monomer. By "the monofunctional aromatic (meth)acrylate monomer", refers to all of the monofunctional aromatic (meth)acrylate monomers present if more than one monofunctional aromatic (meth)acrylate monomer is used. In some embodiments, the monofunctional aromatic (meth)acrylate monomer comprises 50% by weight, or even 75% by weight or greater of the monofunctional aromatic (meth)acrylate monomer. Generally these monofunctional aromatic (meth)acrylate monomers are non-halogenated (e.g. non-brominated).

The curable reaction mixture also comprises at least one second (meth)acrylate monomer with a lower refractive index. A single (meth)acrylate monomer with a lower refractive index may be used or a mixture of different (meth)acrylate monomers with a lower refractive index can be used. As mentioned above, by lower refractive index it is meant that the monomer has a refractive index of less than 1.60.

Among the classes of (meth)acrylate monomers with a lower refractive index that are suitable, are those that have at least one polyalkylene oxide linking group and aliphatic urethane acrylates. As mentioned above, the (meth)acrylate monomer with a lower refractive index helps to provide flexibility to the cured polymeric binder matrix, at the cost of lowering the refractive index of cured polymeric binder matrix.

Examples of (meth)acrylate monomers with at least one polyalkylene oxide linking group include the di(meth)acrylates of general Formula II:

H$_2$C=CR2—(CO)—O—(L-O)$_n$-A-(O-L)$_n$—O—(CO)—R2C=CH$_2$     Formula II where R2 is hydrogen or methyl, (CO) is a carbonyl group C=O, A is divalent group comprising an aromatic or fused aromatic group, the group (O-L)$_n$ represents a polyoxylkylene group comprising repeating —O-L- units, where L is a divalent alkylene group, and where n is an integer of 10 or greater. Examples of fused aromatic groups include naphthyl groups, anthracyl groups, terphenyl groups, and fluorenyl groups. Examples of oxyalkylene groups include polyethylene oxide groups (where the group L is an ethylene group), polypropylene oxide groups (where the group L is a propylene group), and the like.

Examples of particularly suitable monomers of Formula II are those where A is fluorenyl group, (O-L) is a polyethylene oxide group where n is 10 or 20, and R2 is H Commercially available monomers of Formula II include the fluorenyl-based di(meth)acrylate monomers MIRAMER HR 6100 and MIRAMER HR6200 from Miwon Specialty Chemical Co, Ltd., Korea.

The curable reaction mixture may also comprise a second (meth)acrylate monomer where the (meth)acrylate monomer is an aliphatic urethane diacrylate monomer. Examples of suitable aliphatic urethane diacrylate monomers include PHOTOMER 6210 commercially available from IGM Resins, St. Charles, Ill.

The curable, coatable compositions also comprise at least one initiator. Generally the initiator is a photoinitiator, meaning that the initiator is activated by light, typically ultraviolet (UV) light. Photoinitiators are well understood by one of skill in the art of (meth)acrylate polymerization. Examples of suitable free radical photoinitiators include IRGACURE 4265, IRGACURE 184, IRGACURE 651, IRGACURE 1173, IRGACURE 819, IRGACURE TPO, IRGACURE TPO-L, commercially available from BASF, Charlotte, N.C.

Generally the photoinitiator is used in amounts of 0.01 to 1 parts by weight, more typically 0.1 to 0.5, parts by weight relative to 100 parts by weight of total reactive components.

The curable, coatable composition may contain additional reactive or unreactive components, but such components are not necessary as long as the added components are not detrimental to the final properties of the formed (meth)acrylate-based matrix.

In some embodiments, the curable, coatable composition may include at least one solvent. The use of solvents can help to reduce the viscosity of the curable, coatable composition. Examples of suitable solvents include alcohols, ethers, esters, hydrocarbons and the like. Typically, when the curable, coatable composition is coated on a substrate it is dried to remove the solvent prior to curing of the curable reaction mixture.

As mentioned above, the curable, coatable compositions of this disclosure are capable of being coated and cured on a substrate to prepare a coating. The components used to prepare the curable, coatable composition are used to provide a balance of properties, especially a balance of optical and physical properties. Among the optical properties that are important considerations in the coated and cured coatings of this disclosure are optical transparency and refractive index. Among the physical properties that are an important consideration is the flexibility, which in this context generally refers to non-rigidity, or the ability to bend without breaking. In many embodiments, the cured coating is optically clear, having a visible light transmission of at least 88% and a haze of 5% or less, and has a refractive index of at least 1.78. Additionally, the cured coating is capable of passing a 10 millimeter mandrel flexibility test. The details of the mandrel flexibility test are presented in the Examples section.

Also disclosed herein are articles, particularly multilayer articles comprising a first substrate with a first major surface and a second major surface, and a cured or curable optical coating layer adjacent to at least a portion of the second major surface of the first substrate, wherein the cured or curable optical coating layer has a first major surface and a second major surface, the first major surface being adjacent to the second major surface of the first substrate, and the cured or curable optical coating layer is prepared from a curable, coatable composition that has been coated and/or cured. The cured or curable optical coating layer comprises the curable, coatable compositions described above. In some embodiments it may be desirable to coat and cure the curable, coatable compositions, in other embodiments it may be desirable to coat the curable, coatable compositions and apply an additional layer or layers to the exposed surface of the curable coating and cure the layer at a later time.

The optical coating layer may be of any suitable thickness. Generally the optical coating layer comprises a relatively thin layer. Typically the optical coating layer has a thickness of from 1-5 micrometers, or even 2-3 micrometers. As mentioned above, the cured optical coating layer has a refractive index which is 1.78 or above.

A wide range of substrates are suitable for used as the first substrate. Suitable first substrates include a wide array of flexible and non-flexible substrates. For example the first substrate may be glass or a relatively thick layer of a polymeric material such as PMMA (polymethyl methacrylate) or PC (polycarbonate). Alternatively, the first substrate may be flexible polymeric film such as films of PET (polyethylene terephthalate), PEN (polyethylene naphthalate), PC (polycarbonate), polyimide, PEEK (polyetherether ketone), and the like. Particularly suitable flexible substrates are release substrates such as release liners, since the articles described herein can be used as elements in devices, and therefore when the first substrate is a release liner, it is removable permitting the article to be readily incorporated into a device. Release substrates and release liners are well known in the art as articles with low adhesion surfaces.

A wide variety of releasing substrates are suitable. Typically the releasing substrate is a release liner or other film from which the adhesive layer can be readily removed. Exemplary release liners include those prepared from paper (e.g., Kraft paper) or polymeric material (e.g., polyolefins such as polyethylene or polypropylene, ethylene vinyl acetate, polyurethanes, polyesters such as polyethylene terephthalate, and the like, and combinations thereof). At least some release liners are coated with a layer of a release agent such as a silicone-containing material or a fluorocarbon-containing material. Exemplary release liners include, but are not limited to, liners commercially available from CP Film (Martinsville, Va.) under the trade designation "T-30" and "T-10" that have a silicone release coating on polyethylene terephthalate film.

The cured or curable optical coating layer may be directly in contact with the second major surface of the first substrate or there may be one or more intervening layers between the second major surface of the first substrate and the cured or curable layer. In some embodiments, an adhesive layer is located between the second major surface of the first substrate and the cured or curable layer. Typically, this adhesive layer is an optically clear adhesive layer suitable for adhering the cured or curable layer to the surface of a device. Such adhesive layers may be pressure sensitive adhesives or heat activated adhesives.

One class of adhesives that is particularly suitable are optically clear pressure sensitive adhesives. In some embodiments, the optically clear adhesive has a % Transmission of 95% or greater, or even 99% or greater. Also, in some embodiments, the optically clear adhesive has a haze value of 3% or less, or even 1% or less. In some embodiments, the optically clear adhesive has a clarity value of 99% or greater. In some embodiments, the adhesive is an optically clear pressure sensitive adhesive. The pressure sensitive adhesive component can be a single pressure sensitive adhesive or the pressure sensitive adhesive can be a combination of two or more pressure sensitive adhesives.

Optically clear pressure sensitive adhesives useful in the present disclosure include, for example, those based on a polyurea pressure sensitive adhesive polymer, a block copolymer pressure sensitive adhesive polymer, a silicone pressure sensitive adhesive polymer, or a (meth)acrylate-based pressure sensitive adhesive polymer, as described below. As is well understood by one of skill in the art, not all pressure sensitive adhesives are optically clear, but rather optically clear pressure sensitive adhesives are a select subset of pressure sensitive adhesives in general.

Polyurea pressure sensitive adhesives useful in this disclosure include, for example, those disclosed in U.S. Patent Publication No. 2011/0123800 (Sherman et al.). These polyurea pressure sensitive adhesives are generally free of silicone repeat units, and typically include poly alkylene oxide repeat units.

Block copolymer pressure sensitive adhesives generally comprise elastomers of the A-B or A-B-A type, where A represents a thermoplastic polystyrene block and B represents a rubbery block of polyisoprene, polybutadiene, or poly(ethylene/butylene), and resins. Examples of the various block copolymers useful in block copolymer pressure sensitive adhesives include linear, radial, star and tapered styrene-isoprene block copolymers such as "KRATON D1107P", available from Shell Chemical Co., and "EUROPRENE SOL TE 9110", available from EniChem Elastomers Americas, Inc.; linear styrene-(ethylene-butylene) block copolymers such as "KRATON G1657", available from Shell Chemical Co.; linear styrene-(ethylene-propylene) block copolymers such as "KRATON G1750X", available from Shell Chemical Co.; and linear, radial, and star styrene-butadiene block copolymers such as "KRATON D1118X", available from Shell Chemical Co., and "EUROPRENE SOL TE 6205", available from EniChem Elastomers Americas, Inc. The polystyrene blocks tend to form domains in the shape of spheroids, cylinders, or plates that causes the block copolymer pressure sensitive adhesives to have two-phase structures. Resins that associate with the rubber phase generally develop tack in the pressure sensitive adhesive. Examples of rubber phase associating resins include aliphatic olefin-derived resins, such as the "ESCOREZ 1300" series and the "WINGTACK" series, available from Goodyear; rosin esters, such as the "FORAL" series and the "STAYBELITE" Ester 10, both available from Hercules, Inc.; hydrogenated hydrocarbons, such as the "ESCOREZ 5000" series, available from Exxon; polyterpenes, such as the "PICCOLYTE A" series; and terpene phenolic resins derived from petroleum or terpentine sources, such as "PICCOFYN A100", available from Hercules, Inc. Resins that associate with the thermoplastic phase tend to stiffen the pressure sensitive adhesive. Thermoplastic phase associating resins include polyaromatics, such as the "PICCO 6000" series of aromatic hydrocarbon resins, available from Hercules, Inc.; coumarone-indene resins, such as the "CUMAR" series, available from Neville; and other high-solubility parameter resins derived from coal tar or petroleum and having softening points above about 85° C., such as the "AMOCO 18" series of alpha-methyl styrene resins, available from Amoco, "PICCOVAR 130" alkyl aromatic polyindene resin, available from Hercules, Inc., and the "PICCOTEX" series of alpha-methyl styrene/vinyltoluene resins, available from Hercules. Other materials can be added for special purposes, including rubber phase plasticizing hydrocarbon oils, such as, "TUFFLO 6056", available from Lyondell Petrochemical Co., Polybutene-8 from Chevron, "KAYDOL", available from Witco, and "SHELLFLEX 371", available from Shell Chemical Co.; pigments; antioxidants, such as "IRGANOX 1010" and "IRGANOX 1076", both available from Ciba-Geigy Corp., "BUTAZATE", available from Uniroyal Chemical Co., "CYANOX LDTP", available from American Cyanamid, and "BUTASAN", available from Monsanto Co.; antiozonants, such as "NBC", a nickel dibutyldithiocarbamate, available from DuPont; liquid rubbers such as "VISTANEX LMMH" polyisobutylene rubber; and ultraviolet light inhibitors, such as "IRGANOX 1010" and "TINUVIN P", available from Ciba-Geigy Corp.

Silicone pressure sensitive adhesives typically comprise two major components, a polymer or gum, and a tackifying resin. The polymer is typically a high molecular weight polydimethylsiloxane or polydimethyldiphenylsiloxane, that contains residual silanol functionality (SiOH) on the ends of the polymer chain, or a block copolymer comprising polydiorganosiloxane soft segments and urea or oxamide terminated hard segments. The tackifying resin is generally a three-dimensional silicate structure that is endcapped with trimethylsiloxy groups ($OSiMe_3$) and also contains some residual silanol functionality. Examples of tackifying resins include SR 545, from General Electric Co., Silicone Resins Division, Waterford, N.Y., and MQD-32-2 from Shin-Etsu Silicones of America, Inc., Torrance, Calif. Manufacture of typical silicone pressure sensitive adhesives is described in U.S. Pat. No. 2,736,721 (Dexter). Manufacture of silicone urea block copolymer pressure sensitive adhesive is described in U.S. Pat. No. 5,214,119 (Leir, et al). Other materials can be added for special purposes, including pigments, plasticizers, and fillers. Fillers are typically used in amounts from 0 parts to 10 parts per 100 parts of silicone pressure sensitive adhesive. Examples of fillers that can be used include zinc oxide, silica, carbon black, pigments, metal powders and calcium carbonate. One particularly suitable class or siloxane-containing pressure sensitive adhesives are those with oxamide terminated hard segments such as those described in U.S. Pat. No. 7,981,995 (Hays) and U.S. Pat. No. 7,371,464 (Sherman).

(Meth)acrylate pressure sensitive adhesives generally have a glass transition temperature of about 0° C. or less and may comprise from 100 to 80 weight percent of a $C_3$-$C_{12}$ alkyl ester component such as, for example, isooctyl acrylate, 2-ethylhexyl acrylate and n-butyl acrylate and from 0 to 20 weight percent of a polar component such as, for example, acrylic acid, methacrylic acid, ethylene-vinyl acetate units, N-vinylpyrrolidone, and styrene macromer. Generally, the acrylic pressure sensitive adhesives comprise from 0 to 20 weight percent of acrylic acid and from 100 to 80 weight percent of isooctyl acrylate. The acrylic pressure sensitive adhesives may be self-tacky or tackified. Useful tackifiers for acrylics are rosin esters such as "FORAL 85", available from Hercules, Inc., aromatic resins such as "PICCOTEX LC-55WK", aliphatic resins such as "PICCOTAC 95", available from Hercules, Inc., and terpene resins such as α-pinene and β-pinene, available as "PICCOLYTE A-115" and "ZONAREZ B-100" from Arizona Chemical Co. Other materials can be added for special purposes, including hydrogenated butyl rubber, pigments, and curing agents to vulcanize the adhesive partially.

In some embodiments, the article comprising a first substrate and a cured or curable optical coating layer can be prepared directly by coating the curable, coatable composition onto the second major surface of the first substrate and optionally drying and/or curing the optical coating layer. In other embodiments, after the optical coating layer is cured, this process is further extended by applying an adhesive laminate to the exposed first major surface of the optical coating layer. The adhesive laminate typically comprises an adhesive layer laminated to a releasing substrate, and the exposed adhesive surface of this laminate is contacted to the exposes first major surface of the cured optical coating layer. This process generates a laminate construction of the type: releasing substrate/adhesive/cured optical coating layer/first substrate. The first substrate can be removed from this laminate construction to expose the first major surface of the optical coating layer to generate a laminate construction of the type: cured optical coating layer/adhesive/releasing substrate. Removal of the releasing substrate to expose the adhesive layer generates an article suitable for incorporation into a device, or the laminate construction can be modified by the addition of a layer or multiple layers to the exposed first major surface of the cured optical coating layer. In many embodiments, a low refractive index layer is formed on the exposed surface of the cured optical coating layer. This low refractive index layer is described in greater detail below. In other embodiments, the article comprising a first substrate with a cured or curable optical coating layer disposed thereon can also be further modified by the addition of a layer or multiple layers to the exposed second major surface of the cured or curable optical coating layer.

The articles of this disclosure may also include a low refractive index layer. This low refractive index layer is adjacent to and in contact with the cured or curable layer described above. The low refractive index layer has a first major surface and a second major surface, where the first major surface of the low refractive index layer is in contact with the second major surface of the cured or curable optical coating layer such that an interface is formed between the second major surface of the cured optical coating layer and the first major surface of the low refractive index layer. Typically the low refractive index layer has a refractive index of less than 1.55.

In embodiments where the article comprises a cured optical coating layer, the low refractive index layer is contacted to the cured surface of the optical coating layer after curing. In embodiments where the article comprises a curable optical coating layer, the low refractive index layer is contacted to the surface of the optical coating layer prior to curing.

In some embodiments, the interface between the cured or curable optical coating layer and the low refractive index layer may be a structured interface. By this it is meant that the interface is not a smooth and flat interface. By not smooth and flat it is meant that the interface has a deliberate pattern, and does not refer to the normal surface roughness which is natural to any surface. This interface may be a microstructured pattern or more typically a nanostructured pattern.

A structured interface between the cured or curable optical coating layer and the low refractive index layer can be generated by contacting a structured tool to the exposed surface of the cured or curable optical coating layer. Such structured tools are well known in the art for imparting structured patterns to exposed surfaces. Examples of suitable structured tools include structured film tools, such as structured release liners, that is to say release liners with a structured pattern present on its surface.

A wide range of structured film tools, such as release liners with a structured pattern present on its surface (frequently called microstructured release liners) are suitable. Typically the microstructured release liners are prepared by embossing. This means that the release liner has an embossable surface which is contacted to a structured tool with the application of pressure and/or heat to form an embossed surface. This embossed surface is a structured surface. The structure on the embossed surface is the inverse of the structure on the tool surface, that is to say a protrusion on the tool surface will form a depression on the embossed surface, and a depression on the tool surface will form a protrusion on the embossed surface. Nanostructured release liners can be prepared in the same way.

A wide range of low refractive index layers are suitable for use in the articles of this disclosure. Particularly suitable are the polymerizable resins used to prepare collimating film articles described in U.S. Pat. No. 8,012,567 (Gaides et al.).

The polymerizable resin preferably comprises a combination of a first and second polymerizable component selected from difunctional (meth)acrylate monomers, difunctional (meth)acrylate oligomers, and mixtures thereof. As used herein, "monomer" or "oligomer" is any substance that can be converted into a polymer. The term "(meth) acrylate" refers to both acrylate and methacrylate compounds.

The polymerizable composition may comprise a (meth) acrylated urethane oligomer, (meth)acrylated epoxy oligomer, (meth)acrylated polyester oligomer, a (meth)acrylated phenolic oligomer, a (meth)acrylated acrylic oligomer, and mixtures thereof.

In one embodiment, the components of the polymerizable resin are selected such that the polymerizable resin has a low viscosity. Providing a low viscosity polymerizable resin is amenable to increasing production rates. As used herein, viscosity was measured with a rheometric technique according to the test method described in the examples. The viscosity of the polymerizable resin composition is typically less than 50,000 cps at 25° C. Preferably, the viscosity is less than 25,000 cps at 25° C., and more preferably less than 15,000 cps at 25° C. (e.g. less than 12,000 cps, less than 11,000 cps, or less than 10,000 cps at 25° C.). The polymerizable resin composition has an even lower viscosity at elevated temperatures. For example the polymerizable resin may have a viscosity of less than 5000 cps, 4000 cps, 3000 cps, 2000 cps, and even less than 1000 cps at 60° C. Typically, the viscosity is at least 100 cps at 60° C.

In one embodiment, the microstructured (e.g. light-collimating) film is the reaction product of a polymerizable resin comprising at least two different (e.g. difunctional) polymerizable components. The components are preferably (meth) acrylate monomers, (meth)acrylate oligomers, or mixtures of at least one monomer and at least one oligomer. The first component and second components are typically each present in the polymerizable composition in an amount of at least about 20 wt-% (e.g. 30 wt-%, 35 wt-%, 40 wt-%, 45 wt-% and 50 wt-% and any amount between such stated values). The amount of any one of these components generally does not exceed about 70 wt-%.

Typically the ratio of the first polymerizable component to the second polymerizable component ranges from 4:1 to 1:4. In some embodiments, the ratio can range from 3:1 to 1:3 or can range from 2:1 to 1:2. Further, the combination of these two components typically ranges from about 50 wt-% to about 90% wt-% of the total polymerizable resin composition. The first polymerizable component typically has a viscosity of at least about 5000 cps at 60° C. The second polymerizable component typically has viscosity less than the first polymerizable component. For example the second polymerizable component may have a viscosity of no greater than 25%, 30%, 35%, 40%, 45%, or no greater than 50% of the first polymerizable component.

The low viscosity polymerizable composition is preferably substantially solvent free. "Substantially solvent free" refer to the polymerizable composition having less than 1 wt-% and 0.5 wt-% of (e.g. organic) solvent. The concentration of solvent can be determined by known methods, such as gas chromatography. Solvent concentrations of less than 0.5 wt-% are preferred.

The kinds and amounts of polymerizable monomer and oligomers are preferably also selected to obtain certain elastic modulus criteria. In one embodiment, a difunctional (meth)acrylate monomer or oligomer is employed wherein the homopolymer of the monomer of oligomer has an elastic tensile modulus of less than $1\times10^8$ Pa at 80° F. (26.7° C.) as measured according to ASTM D5026-01. Such monomer or oligomer is combined with a different difunctional (meth) acrylate monomer or oligomer having an elastic tensile modulus of at least $1\times10^8$ Pa at 80° F. or greater. The difference in elastic modulus is typically at least $5\times10^7$ Pa at 80° F. In some embodiments, the high elastic modulus component may have an elastic modulus of at least $2\times10^8$ Pa, $4\times10^8$ Pa, $6\times10^8$ Pa, $8\times10^8$ Pa, or at least $1\times10^9$ Pa at 80° F. The high modulus component typically has a tensile elastic modulus of no greater than $8\times10^9$ Pa at 80° F.

The elastic modulus of the cured (e.g. transparent) film can be characterized by nanoindentation according to the method further described in the examples.

Polymerizable compositions having too high of an elastic modulus tend not to release from the tool during manufacturing; whereas compositions having too low of an elastic modulus tend to fail cohesively upon release from the mold tool.

Various kinds and amounts of polymerizable monomers and oligomers can be employed to provide compositions meeting any one or combination of the described transmission, viscosity, and elastic modulus criteria.

In one embodiment, a polymerizable resin composition is described comprising at least about 20 wt-% (e.g. aliphatic) urethane (meth)acrylate oligomer(s); and at least about 20 wt-% bisphenol-A ethoxylated diacrylate monomer(s).

The urethane (meth)acrylate oligomer(s) may be present in the polymerizable composition in an amount of at least about 20 wt-% (e.g. 25 wt-%, 30 wt-%, 35 wt-%, 40 wt-%, 45 wt-% and 50 wt-% and any amount there between). Typically, the amount of urethane (meth)acrylate oligomer does not exceed about 70 wt-%.

Likewise, the bisphenol-A ethoxylated diacrylate monomer(s) may be present in the polymerizable composition in an amount of at least about 20 wt-% (e.g. 25, wt-%, 30 wt-%, 35 wt-%, 40 wt-%, 45 wt-% and 50 wt-% and any amount there between). Typically, the amount of monomer of bisphenol-A ethoxylated diacrylate monomer(s) does not exceed about 70 wt-%.

Typically the ratio of urethane (meth)acrylate oligomer(s) to bisphenol-A ethoxylated diacrylate monomer(s) ranges from 4:1 to 1:4. In some embodiments, this ratio is 3:1 to 1:2 or 1 to 1.4.

One exemplary (e.g. aliphatic) urethane diacrylate is commercially available from Cognis under the trade designations "Photomer 6010" (reported to have a viscosity of 5,900 mPa·s at 60° C., elongation of 45% and a Tg of −7°

C.). Other urethane diacrylates having a low viscosity that may also be suitable include for example "Photomer 6217" and "Photomer 6230" (both reported to have a viscosity of 3,500 mPa·s at 60° C., an elongation of 27% and 69% respectively, and a Tg of 35° C. and 2° C. respectively); "Photomer 6891"(reported to have viscosity of 8,000 mPa·s at 60° C., elongation of 60% and a Tg of 28° C.); and "Photomer 6893-20R" (reported to have a viscosity of 2,500 mPa·s at 60° C., an elongation of 42%, and a Tg of 41° C.). It is surmised that use of a urethane (meth)acrylate having a higher Tg (i.e. above that of Photomer 6010) may be blended with a second polymerizable monomer having a homopolymer with a Tg lower than 60° C. (i.e. the Tg of SR602). Other urethane diacrylates are commercially available from Sartomer as well as from UCB.

One exemplary bisphenol-A ethoxylated diacrylate monomer is commercially available from Sartomer under the trade designations "SR602" (reported to have a viscosity of 610 cps at 20° C. and a Tg of 2° C.).

In another embodiment, a polymerizable resin composition is described comprising at least about 40 wt-% bisphenol-A ethoxylated diacrylate monomer(s). A first bisphenol-A ethoxylated diacrylate monomer, such as SR 602, combined with a second bisphenol-A ethoxylated diacrylate monomer, such as commercially available from Sartomer under the trade designations "SR601" (reported to have a viscosity of 1080 cps at 20° C. and a Tg of 60° C.). A homopolymer of the first bisphenol-A ethoxylated diacrylate monomer has a different Tg that the homopolymer of the second bisphenol-A ethoxylated diacrylate monomer. The first bisphenol-A ethoxylated diacrylate monomer has a Tg below 25° C. (e.g. less than 20° C., 15° C., 10° C., or even 0° C.) whereas the second bisphenol-A ethoxylated diacrylate monomer has a Tg above 25° C. (e.g. 30° C., 35° C., 40° C., 45° C., 50° C., or even 55° C. The difference is Tg of the homopolymers of the first and second bisphenol-A ethoxylated diacrylate monomer is typically at least 20° C., 30° C., 40° C., or even 50° C.

The first and second bisphenol-A ethoxylated diacrylate monomers are each typically present in the polymerizable composition in an amount of at least about 20 wt-% (e.g. 25 wt-%, 30 wt-%, 35 wt-%, 40 wt-%, 45 wt-% and 50 wt-% and any amount there between) with the proviso that the total amount of bisphenol-A ethoxylated diacrylate monomer typically does not exceed about 90 wt-%.

The ratio of the first to second bisphenol-A ethoxylated diacrylate monomer may range from 3:1 to 1:3. In some embodiments, this ratio is about 2 to 1.

Other difunctional (meth)acrylate monomers that may be employed in the polymerizable composition include for example triethylene glycol di(meth)acrylate, ethylene glycol di(meth)acrylate, tetraethylene glycol di(meth)acrylate, polyethylene glycol di(meth)acrylate; 1,3-butylene glycol di(meth)acrylate; 1,4-butanediol di(meth)acrylate; diethylene glycol di(meth)acrylate; and 1,6-hexanediol di(meth)acrylate.

The polymerizable resin optionally, yet preferably further comprises at least one crosslinker having three or more (meth)acrylate groups. When a crosslinker is present, it is preferably present in the polymerizable composition in an amount of at least about 2 wt-%. Typically, the amount of crosslinker is not greater than about 25 wt-%. The cross-linking agent may be present in any amount ranging from about 5 wt-% to about 15 wt-%.

Suitable crosslinkers include for example, pentaerythritol tri(meth)acrylate, pentaerythritol tetra(meth)acrylate, trimethylolpropane tri(meth)acrylate, dipentaerythritol penta(meth)acrylate, dipentaerythritol hexa(meth)acrylate, trimethylolpropane ethoxylate tri(meth)acrylate, glyceryl tri(meth)acrylate, pentaerythritol propoxylate tri(meth)acrylate, and di-trimethylolpropane tetra(meth)acrylate. Any one or combination of crosslinkers may be employed. Since methacrylate groups tend to be less reactive than acrylate groups, the crosslinker(s) are preferably free of methacrylate functionality.

Various crosslinkers are commercially available. For example, pentaerythritol triacrylate (PETA) and dipentaerythritol pentaacrylate are commercially available from Sartomer Company, Exton, PA under the trade designations "SR444" and "SR399LV" respectively. PETA is also available from Osaka Organic Chemical Industry, Ltd. Osaka, Japan under the trade designation "Viscoat #300"; from Toagosei Co. Ltd., Tokyo, Japan under the trade designation "Aronix M-305"; and from Eternal Chemical Co., Ltd., Kaohsiung, Taiwan under the trade designation "Etermer 235". Trimethylol propane triacrylate (TMPTA) and ditrimethylol propane tetraacrylate (di-TMPTA) are commercially available from Sartomer Company under the trade designations "SR351" and "SR355". TMPTA is also available from Toagosei Co. Ltd. under the trade designation "Aronix M-309". Further, ethoxylated trimethylolpropane triacrylate and ethoxylated pentaerythritol triacrylate are commercially available from Sartomer under the trade designations "SR454" and "SR494" respectively.

The polymerizable composition may optionally include a (e.g. monofunctional) reactive diluent, for example having a number average molecular weight no greater than 450 g/mole. When present, the amount of reactive diluent may range from 1 wt-% to about 10 wt-%. Suitable reactive diluents include for example allyl (meth)acrylate, tetrahydrofurfuryl (meth)acrylate, isodecyl (meth)acrylate, 2(2-ethoxythoxy) ethyl (meth)acrylate, stearyl (meth)acrylate, lauryl (meth)acrylate, 2-phenoxyethyl (meth)acrylate, gylcidyl (meth)acrylate, isobornyl (meth)acrylate, isooctyl (meth)acrylate, tridecyl (meth)acrylate, caprolactone (meth)acrylate, propoxylated allyl (meth)acrylate, methoxy polyethylene glycol monomethacylate, ethoxylated hydroxymethyl (meth)acrylate, polypropylene glycol monomethacylate, alkoxylated tertahydrofurfuryl (meth)acrylate, and ethoxylated nonyl phenol (meth)acrylate.

Radiation (e.g. UV) curable compositions generally include a least one photoinitiator. The photoinitiator or combination of photoiniators can be used at a concentration of about 0.1 to about 10 weight percent. More preferably, the photoinitiator or combination thereof is used at a concentration of about 0.2 to about 3 wt-%.

In general the photoinitiator(s) are at least partially soluble (e.g. at the processing temperature of the resin) and substantially colorless after being polymerized. The photoinitiator may be (e.g. yellow) colored, provided that the photoinitiator is rendered substantially colorless after exposure to the UV light source.

Suitable photoinitiators include monoacylphosphine oxide and bisacylphosphine oxide. Commercially available mono or bisacylphosphine oxide photoinitiators include 2,4,6-trimethylbenzoydiphenylphosphine oxide, commercially available from BASF (Charlotte, N.C.) under the trade designation "Lucirin TPO"; ethyl-2,4,6-trimethylbenzoylphenyl phosphinate, also commercially available from BASF under the trade designation "Lucirin TPO-L"; and bis (2,4,6-trimethylbenzoyl)-phenylphosphine oxide commercially available from Ciba Specialty Chemicals under the trade designation "Irgacure 819". Other suitable photoinitiators include 2-hydroxy-2-methyl-1-phenyl-propan-1-one, commercially available from Ciba Specialty Chemicals under the trade designation "Darocur 1173" as well as other photoinitiators commercially available from Ciba Specialty Chemicals under the trade designations "Darocur 4265", "Irgacure 651", "Irgacure 1800", "Irgacure 369", "Irgacure 1700", and "Irgacure 907".

The low refractive index layer may be any suitable thickness. Generally, the low refractive index layer, like the optical coating layer is relatively thin, but may be thicker than the optical coating layer. Typically the low refractive index coating has a thickness of from 2-10 micrometers, or even 3-7 micrometers.

As both the optical coating layer and the low refractive index layer are generally photocurable layers, a variety of sequences can be used to prepare articles that contain these layers. For example, the curable, coatable composition can be coated onto the first substrate or an adhesive layer located on the first substrate to form an optical coating layer. The optical coating layer can then be optionally dried if desired and cured. To this cured optical coating layer can be applied the polymerizable resin material to form the low refractive index layer, and the polymerizable resin material can be cured. In the alternative, the curable, coatable composition can be coated onto the first substrate or an adhesive layer located on the first substrate to form an optical coating layer. The optical coating layer can then be optionally dried if desired. To this curable optical coating layer can be applied the polymerizable resin material to form the low refractive index layer, and the curable optical coating layer and the polymerizable resin material can be cured at the same time. Additionally, a structured film tool can be contacted to the optical coating layer prior to curing or prior to the application of the polymerizable resin material.

The articles of this disclosure may additionally comprise additional layers. In some embodiments, a second substrate may be adjacent to the second major surface of the low refractive index layer. This second substrate may be the same as the first substrate or it may be different. In many embodiments, the second substrate comprises a release substrate. In this way the second substrate is removable to facilitate the use of the articles of this disclosure in devices. In many embodiments, the second substrate may have an adhesive layer coated on it with this adhesive layer in contact with the second major surface of the low refractive index layer. In this way the second substrate can be removed to expose the adhesive layer and thus facilitate the incorporation of the multilayer optical articles of this disclosure into devices.

FIG. 1 shows an embodiment of a multilayer optical article of this disclosure. FIG. 1 shows article 100, a multilayer optical article with layers 140, 110, 120, 130, and 150. Layer 140 is a substrate that is in contact with layer 110. In article 100, substrate 140 is a releasing substrate such as a release liner, and layer 110 is an optical adhesive layer. Layer 120 is a high refractive index optical layer and layer 130 is a low refractive index layer. In the embodiment shown in FIG. 1 the interface between layers 120 and 130 is a structured interface, but this need not be the case. Layer 150 is in contact with layer 130, and may comprise a single layer or multiple layers. In article 100, layer 150 may a releasing substrate such as a release liner, or layer 150 may be an adhesive layer where the adhesive surface of layer 150 is in contact with layer 130, or layer 150 may be an adhesive laminate with an adhesive layer in contact with layer 130 and a releasing substrate in contact with the adhesive layer.

Figure 2:
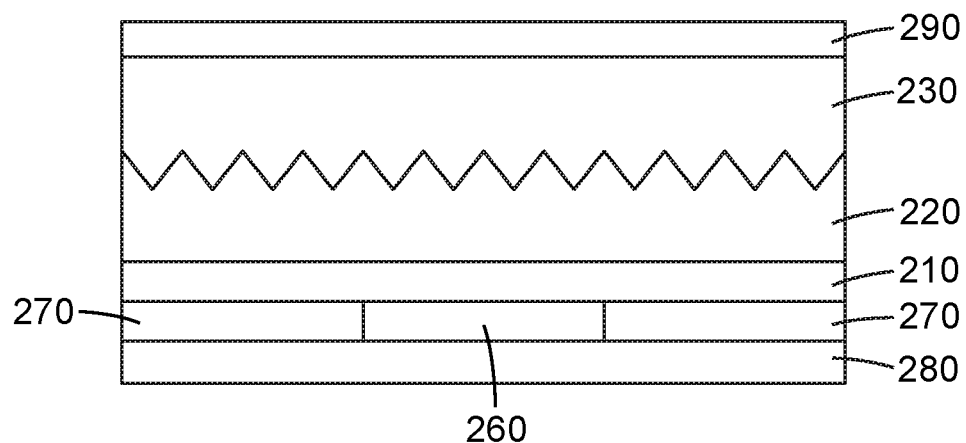
FIG. 2 shows a cross-sectional view of a device of this disclosure.

Also disclosed herein are devices that comprise the multilayer optical articles described above. Examples of devices include OLED devices. An example of such a device is shown in FIG. 2. FIG. 2 shows an article that comprises substrate 280 with device 260 disposed on substrate 280. Layer 270 is a passivation layer. As with FIG. 1 above, adhesive layer 210, high refractive index optical layer 220 and low refractive index layer 230 are in contact with device 260 and layer 270. As in FIG. 1 the interface between layers 220 and 230 is a structured interface. FIG. 2 also includes optional layer 290 which may be a single layer or multiple layers and may include both organic and inorganic layers and may include adhesive layers, optical layers, and the like. Layers 210 (optical adhesive), 220 (high refractive index optical layer), and 230 (low refractive index layer) are the same as described above for FIG. 1.

Also disclosed herein are methods of making optical articles. These optical articles are multilayer optical articles that can be used to prepare devices such as OLED devices. This method comprises providing a first substrate with a first major surface and a second major surface, providing a curable, coatable composition as described above, coating the curable, coatable composition on at least a portion of the second major surface of the first substrate to form a coating with a first major surface and a second major surface, wherein the first major surface of the coating is adjacent to the second major surface of the first substrate, optionally drying the coating, and curing the optical coating layer.

In some embodiments, after the optical coating layer is cured, an adhesive laminate article can be contacted to the exposed surface of the optical coating layer to generate a laminate construction. The adhesive laminate article comprises an adhesive layer and a releasing substrate. The first substrate can be removed from the laminate construction to generate an article with the general configuration: releasing substrate/adhesive layer/cured optical coating layer. If the first substrate comprises a structured release liner, the exposed surface of the optical coating layer can thus be a structured surface.

In some embodiments, prior to curing of the optical coating layer, the exposed surface of the optical coating layer is contacted to a structuring tool to generate a structured surface. The structured surface may be a microstructured surface or a nanostructured surface.

In some embodiments, a curable low refractive index material is coated onto the surface of the coated optical coating layer. This low refractive index coating may be contacted to the coated optical coating layer either prior to the curing of the coated optical coating layer or after the curing of the coated optical coating layer. Additionally, the optical coating layer to which the curable low refractive index material is coated, may have a structured surface as described above. The curable low refractive index material is cured. If the coated optical coating layer is uncured, it can be simultaneously cured along with the low refractive index material.

In some embodiments, a second substrate is contacted to the low refractive index layer. This substrate may be a releasing substrate such as a release liner. The second substrate may be contacted to the low refractive index prior to curing. In other embodiments, the second substrate comprises an adhesive laminate article comprising an adhesive layer and a releasing substrate. The adhesive layer is contacted to the low refractive index layer to generate a laminate construction. The releasing substrate can be removed from this laminate construction to expose the adhesive layer.

This disclosure includes the following embodiments:

Among the embodiments are curable, coatable compositions. Embodiment 1 includes a curable, coatable composition comprising: surface-treated inorganic nanoparticles with a high refractive index, wherein the surface-treated inorganic nanoparticles have been treated with a surface treatment agent comprising a silane surface treatment agent; and a curable reaction mixture, wherein the curable reaction mixture comprises: a first (meth)acrylate monomer comprising a high refractive index (meth)acrylate monomer with a refractive index of 1.6 or higher; a second (meth)acrylate monomer comprising a lower refractive index (meth)acrylate monomer with a refractive index of less than 1.6; and at least one initiator.

Embodiment 2 is the curable, coatable composition of embodiment 1, wherein the curable, coatable composition is capable of being coated and cured on a substrate to prepare a coating which is optically clear, having a visible light transmission of at least 88% and a haze of 5% or less, and has a refractive index of at least 1.78, and wherein the coating is capable of passing a 10 millimeter mandrel flexibility test.

Embodiment 3 is the curable, coatable composition of embodiment 1 or 2, wherein the first (meth)acrylate monomer comprising a high refractive index of 1.6 or greater comprises a compound of Formula I:

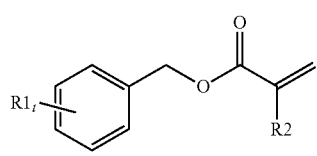

Formula I wherein at least one R1 comprises an aromatic substituent; t is an integer from 1 to 4; and R2 is hydrogen or methyl.

Embodiment 4 is the curable, coatable composition of embodiment 3, wherein the compound comprises at least one aromatic substituent R1 comprising: a substituted or unsubstituted aromatic group of the type —CH$_2$—Ar; or a heteroatom linked aromatic group of the type -X—Ar, where X is S or O, and each Ar is independently a substituted or unsubstituted phenyl group, a fused aromatic group, or 2 or more alkyl group-linked phenyl or substituted phenyl groups.

Embodiment 5 is the curable, coatable composition of embodiment 3 or 4, wherein the at least one R1 group comprises:

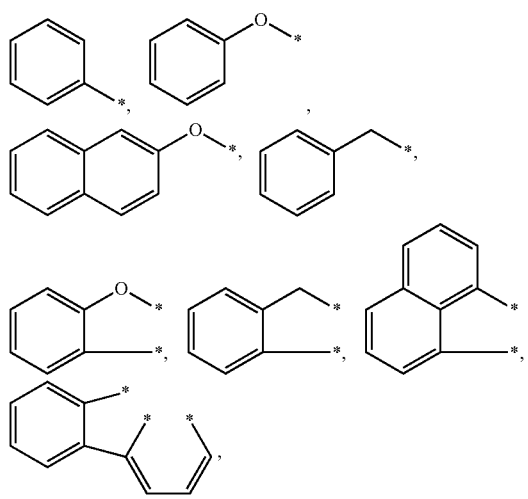

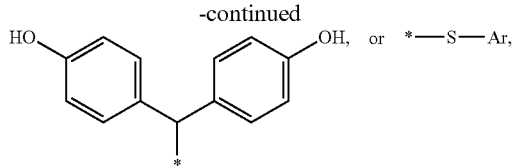

where each * denotes the point(s) of attachment to the aromatic ring of Formula I; and Ar is a substituted or unsubstituted phenyl group, a fused aromatic group, or 2 or more alkyl group-linked phenyl or substituted phenyl groups.

Embodiment 6 is the curable, coatable composition of any of embodiments 1-5, wherein the second (meth)acrylate monomer comprising a lower refractive index (meth)acrylate monomer with a refractive index of less than 1.6 comprises a (meth)acrylate monomer with at least one alkylene oxide linking group or urethane (meth)acrylate monomer.

Embodiment 7 is the curable, coatable composition of embodiment 6, wherein the (meth)acrylate monomer with at least one alkylene oxide linking group comprises a compound of Formula II:

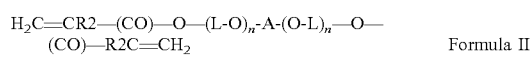

wherein R2 is hydrogen or methyl; (CO) is a carbonyl group C=O; A is divalent group comprising an aromatic or fused aromatic group; the group (O-L)$_n$ represents a polyoxylkylene group comprising repeating —O-L- units, where L is a divalent alkylene group; and n is an integer of 10 or greater.

Embodiment 8 is the curable, coatable composition of embodiment 7, wherein A is a fused aromatic group comprising a naphthyl group or a fluorenyl group; L comprises an ethylene or propylene group; and n is 10 or 20.

Embodiment 9 is the curable, coatable composition of any of embodiments 1-8, wherein the at least one initiator comprises at least one photoinitiator.

Embodiment 10 is the curable, coatable composition of any of embodiments 1-9, wherein the inorganic nanoparticles with a high refractive index comprise metal oxide nanoparticles selected from zirconia nanoparticles or titania nanoparticles.

Embodiment 11 is the curable, coatable composition of any of embodiments 1-10, wherein the inorganic nanoparticles comprise at least 64% by weight of the coatable composition based upon the total solid weight curable, coatable composition.

Embodiment 12 is the curable, coatable composition of any of embodiments 1-11, wherein the curable, coatable composition further comprises at least one solvent.

Also disclosed are articles. Embodiment 13 includes an article comprising: a first substrate with a first major surface and a second major surface; and a cured or curable optical coating layer adjacent to at least a portion of the second major surface of the first substrate, wherein the cured or curable optical coating layer is prepared from a curable, coatable composition that has been coated and optionally cured, wherein the curable, coatable composition comprises: surface-treated inorganic nanoparticles with a high refractive index, wherein the surface-treated inorganic nanoparticles have been treated with a surface treatment agent comprising a silane surface treatment agent; and a curable reaction mixture, wherein the curable reaction mixture comprises: a first (meth)acrylate monomer comprising a high refractive index (meth)acrylate monomer with a refractive index of 1.6 or higher; a second (meth)acrylate monomer comprising a lower refractive index (meth)acrylate monomer with a refractive index of less than 1.6; and at least one initiator.

Embodiment 14 is the article of embodiment 13, wherein the curable, coatable composition is capable of being coated and cured on a substrate to prepare a coating which is optically clear, having a visible light transmission of at least 88% and a haze of 5% or less, and has a refractive index of at least 1.78, and wherein the coating is capable of passing a 10 millimeter mandrel flexibility test.

Embodiment 15 is the article of embodiment 13 or 14, wherein the first (meth)acrylate monomer comprising a high refractive index of 1.6 or greater comprises a compound of Formula I:

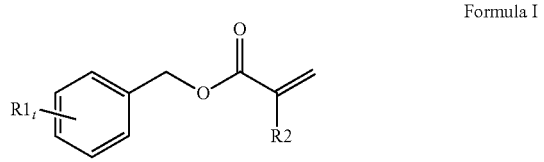

Formula I wherein at least one R1 comprises an aromatic substituent; t is an integer from 1 to 4; and R2 is hydrogen or methyl.

Embodiment 16 is the article of embodiment 15, wherein the compound comprises at least one aromatic substituent R1 comprising: a substituted or unsubstituted aromatic group of the type —CH$_2$—Ar; or a heteroatom linked aromatic group of the type -X—Ar, where X is S or O, and each Ar is independently a substituted or unsubstituted phenyl group, a fused aromatic group, or 2 or more alkyl group-linked phenyl or substituted phenyl groups.

Embodiment 17 is the article of embodiment 15 or 16, wherein the at least one R1 group comprises:

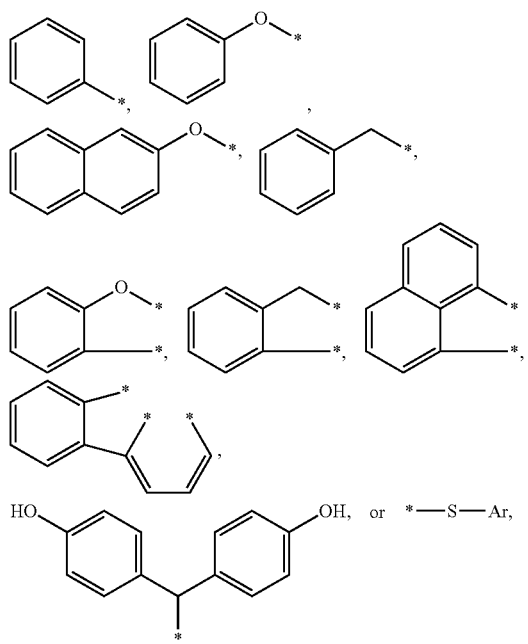

where each * denotes the point(s) of attachment to the aromatic ring of Formula I; and Ar is a substituted or unsubstituted phenyl group, a fused aromatic group, or 2 or more alkyl group-linked phenyl or substituted phenyl groups.

Embodiment 18 is the article of any of embodiments 13-17, wherein the second (meth)acrylate monomer comprising a lower refractive index (meth)acrylate monomer with a refractive index of less than 1.6 comprises a (meth)acrylate monomer with at least one alkylene oxide linking group or urethane (meth)acrylate monomer.

Embodiment 19 is the article of embodiment 18, wherein the (meth)acrylate monomer with at least one alkylene oxide linking group comprises a compound of Formula II:

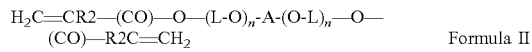

Formula II wherein R2 is hydrogen or methyl; (CO) is a carbonyl group C=O; A is divalent group comprising an aromatic or fused aromatic group; the group (O-L)$_n$ represents a polyoxylkylene group comprising repeating —O-L- units, where L is a divalent alkylene group; and n is an integer of 10 or greater.

Embodiment 20 is the article of embodiment 19, wherein A is a fused aromatic group comprising a naphthyl group or a fluorenyl group; L comprises an ethylene or propylene group; and n is 10 or 20.

Embodiment 21 is the article of any of embodiments 13-20, wherein the at least one initiator comprises at least one photoinitiator.

Embodiment 22 is the article of any of embodiments 13-21, wherein the inorganic nanoparticles with a high refractive index comprise metal oxide nanoparticles selected from zirconia nanoparticles or titania nanoparticles.

Embodiment 23 is the article of any of embodiments 13-22, wherein the inorganic nanoparticles comprise at least 64% by weight of the coatable composition based upon the total solid weight curable, coatable composition.

Embodiment 24 is the article of any of embodiments 13-23, wherein the curable, coatable composition further comprises at least one solvent.

Embodiment 25 is the article of any of embodiments 13-24, further comprising an adhesive layer between the second major surface of the first substrate and the cured or curable optical coating layer.

Embodiment 26 is the article of any of embodiments 13-24, further comprising a low refractive index layer in contact with the cured or curable optical coating layer such that an interface is formed between the cured or curable optical coating layer and the low refractive index layer.

Embodiment 27 is the article of embodiment 26, wherein the interface between the cured or curable optical coating layer and the low refractive index layer comprises a nanostructured surface interface.

Embodiment 28 is the article of embodiment 26 or 27, further comprising a removable substrate adjacent to the low refractive index coating layer.

Embodiment 29 is the article of embodiment 26 or 27, wherein the optical coating layer comprises a cured optical coating layer having a refractive index of at least 1.78.

Also disclosed are devices that comprise a multilayer optical article. Embodiment 30 includes a device comprising a multilayer optical article, wherein the device comprises a device surface with a multilayer optical article attached to the device surface, wherein the multilayer optical article comprises: an adhesive layer in contact with the device surface; and a cured optical coating layer contacting the adhesive layer, wherein the cured optical coating layer is prepared from a curable, coatable composition that has been coated and cured, wherein the curable, coatable composition comprises: surface-treated inorganic nanoparticles with a high refractive index, wherein the surface-treated inorganic nanoparticles have been treated with a surface treatment agent comprising a silane surface treatment agent; and a curable reaction mixture, wherein the curable reaction mixture comprises: a first (meth)acrylate monomer comprising a high refractive index (meth)acrylate monomer with a refractive index of 1.6 or higher; a second (meth)acrylate monomer comprising a lower refractive index (meth)acrylate monomer with a refractive index of less than 1.6; and at least one initiator; and wherein the cured optical coating layer is optically clear, having a visible light transmission of at least 88% and a haze of 5% or less, and has a refractive index of at least 1.78, and is capable of passing a 10 millimeter mandrel flexibility test.

Embodiment 31 is the device of embodiment 30, wherein the first (meth)acrylate monomer comprising a high refractive index of 1.6 or greater comprises a compound of Formula I:

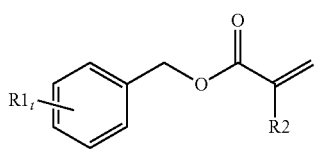

Formula I wherein at least one R1 comprises an aromatic substituent; t is an integer from 1 to 4; and R2 is hydrogen or methyl.

Embodiment 32 is the device of embodiment 31, wherein the compound comprises at least one aromatic substituent R1 comprising: a substituted or unsubstituted aromatic group of the type —$CH_2$—Ar; or a heteroatom linked aromatic group of the type -X—Ar, where X is S or O, and each Ar is independently a substituted or unsubstituted phenyl group, a fused aromatic group, or 2 or more alkyl group-linked phenyl or substituted phenyl groups.

Embodiment 33 is the device of embodiment 31 or 32, wherein the at least one R1 group comprises:

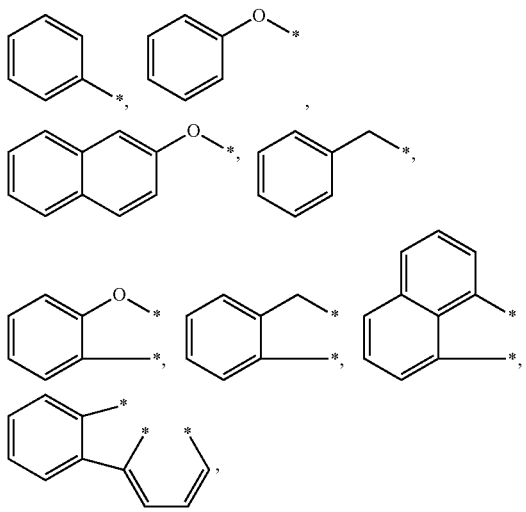

-continued

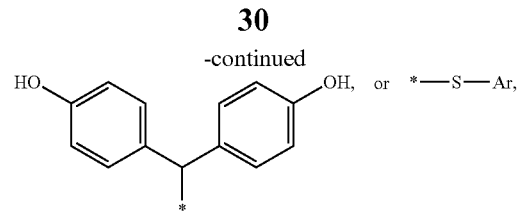

where each * denotes the point(s) of attachment to the aromatic ring of Formula I; and Ar is a substituted or unsubstituted phenyl group, a fused aromatic group, or 2 or more alkyl group-linked phenyl or substituted phenyl groups.

Embodiment 34 is the device of any of embodiments 30-33, wherein the second (meth)acrylate monomer comprising a lower refractive index (meth)acrylate monomer with a refractive index of less than 1.6 comprises a (meth) acrylate monomer with at least one alkylene oxide linking group or urethane (meth)acrylate monomer.

Embodiment 35 is the device of embodiment 34, wherein the (meth)acrylate monomer with at least one alkylene oxide linking group comprises a compound of Formula II:

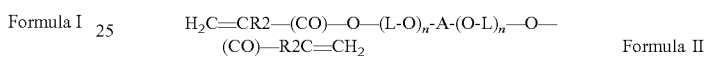

Formula II wherein R2 is hydrogen or methyl; (CO) is a carbonyl group C=O; A is divalent group comprising an aromatic or fused aromatic group; the group (O-L)$_n$ represents a polyoxylkylene group comprising repeating —O-L- units, where L is a divalent alkylene group; and n is an integer of 10 or greater.

Embodiment 36 is the device of embodiment 35, wherein A is a fused aromatic group comprising a naphthyl group or a fluorenyl group; L comprises an ethylene or propylene group; and n is 10 or 20.

Embodiment 37 is the device of any of embodiments 30-36, wherein the at least one initiator comprises at least one photoinitiator.

Embodiment 38 is the device of any of embodiments 30-37, wherein the inorganic nanoparticles with a high refractive index comprise metal oxide nanoparticles selected from zirconia nanoparticles or titania nanoparticles.

Embodiment 39 is the device of any of embodiments 30-38, wherein the inorganic nanoparticles comprise at least 64% by weight of the coatable composition based upon the total solid weight curable, coatable composition.

Embodiment 40 is the device of any of embodiments 30-39, wherein the curable, coatable composition further comprises at least one solvent.

Embodiment 41 is the device of any of embodiments 30-40, further comprising a low refractive index layer in contact with the cured optical coating layer such that an interface is formed between the cured optical coating layer and the low refractive index layer.

Embodiment 42 is the device of embodiment 41, wherein the interface between the cured optical coating layer and the low refractive index layer comprises a nanostructured interface.

Embodiment 43 is the device of embodiment 41, further comprising at least one additional layer in contact with the low refractive index layer, wherein the at least one additional layer comprises an adhesive layer, an organic layer, or an inorganic layer.

Embodiment 44 is the device of any of embodiments 30-43, wherein the device surface comprises the surface of an OLED device.

Also disclosed are methods of preparing optical articles. Embodiment 45 includes a method of preparing an optical article comprising: providing a first substrate with a first major surface and a second major surface; providing a curable, coatable composition comprising: surface-treated inorganic nanoparticles with a high refractive index, wherein the surface-treated inorganic nanoparticles have been treated with a surface treatment agent comprising a silane surface treatment agent; and a curable reaction mixture, wherein the curable reaction mixture comprises: a first (meth)acrylate monomer comprising a high refractive index (meth)acrylate monomer with a refractive index of 1.6 or higher; a second (meth)acrylate monomer comprising a lower refractive index (meth)acrylate monomer with a refractive index of less than 1.6; and at least one initiator; coating the curable, coatable composition on at least a portion of the second major surface of the first substrate to form an optical coating layer adjacent to the second major surface of the first substrate; curing the optical coating layer.

Embodiment 46 is the method of embodiment 45, wherein the curable, coatable composition is capable of being coated and cured on a substrate to prepare a coating which is optically clear, having a visible light transmission of at least 88% and a haze of 5% or less, and has a refractive index of at least 1.78, and wherein the coating is capable of passing a 10 millimeter mandrel flexibility test.

Embodiment 47 is the method of embodiment 45 or 46, wherein the first (meth)acrylate monomer comprising a high refractive index of 1.6 or greater comprises a compound of Formula I:

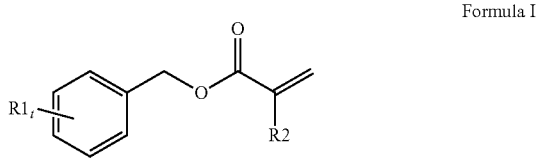

Formula I wherein at least one R1 comprises an aromatic substituent; t is an integer from 1 to 4; and R2 is hydrogen or methyl.

Embodiment 48 is the method of embodiment 47, wherein the compound comprises at least one aromatic substituent R1 comprising: a substituted or unsubstituted aromatic group of the type —CH$_2$—Ar; or a heteroatom linked aromatic group of the type -X—Ar, where X is S or O, and each Ar is independently a substituted or unsubstituted phenyl group, a fused aromatic group, or 2 or more alkyl group-linked phenyl or substituted phenyl groups.

Embodiment 49 is the method of embodiment 47 or 48, wherein the at least one R1 group comprises:

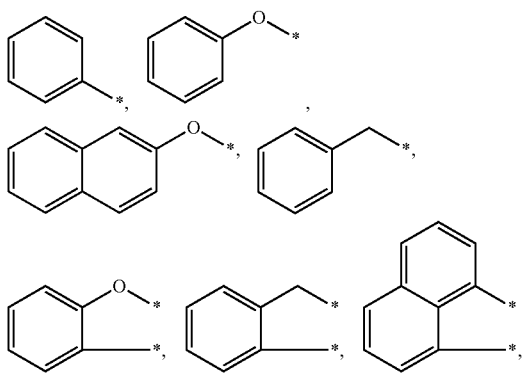

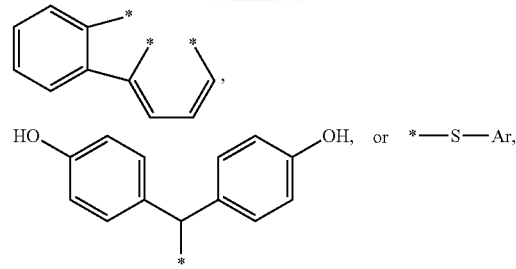

-continued

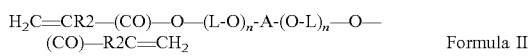

where each * denotes the point(s) of attachment to the aromatic ring of Formula I; and Ar is a substituted or unsubstituted phenyl group, a fused aromatic group, or 2 or more alkyl group-linked phenyl or substituted phenyl groups.

Embodiment 50 is the method of any of embodiments 45-49, wherein the second (meth)acrylate monomer comprising a lower refractive index (meth)acrylate monomer with a refractive index of less than 1.6 comprises a (meth) acrylate monomer with at least one alkylene oxide linking group or urethane (meth)acrylate monomer.

Embodiment 51 is the method of embodiment 50, wherein the (meth)acrylate monomer with at least one alkylene oxide linking group comprises a compound of Formula II:

$$H_2C=CR2-(CO)-O-(L-O)_n\text{-}A\text{-}(O\text{-}L)_n-O-(CO)-R2C=CH_2 \qquad \text{Formula II}$$

wherein R2 is hydrogen or methyl; (CO) is a carbonyl group C=O; A is divalent group comprising an aromatic or fused aromatic group; the group (O-L)$_n$ represents a polyoxylkylene group comprising repeating —O-L- units, where L is a divalent alkylene group; and n is an integer of 10 or greater.

Embodiment 52 is the method of embodiment 51, wherein A is a fused aromatic group comprising a naphthyl group or a fluorenyl group; L comprises an ethylene or propylene group; and n is 10 or 20.

Embodiment 53 is the method of any of embodiments 45-52, wherein the at least one initiator comprises at least one photoinitiator.

Embodiment 54 is the method of any of embodiments 45-53, wherein the inorganic nanoparticles with a high refractive index comprise metal oxide nanoparticles selected from zirconia nanoparticles or titania nanoparticles.

Embodiment 55 is the method of any of embodiments 45-54, wherein the inorganic nanoparticles comprise at least 64% by weight of the coatable composition based upon the total solid weight curable, coatable composition.

Embodiment 56 is the method of any of embodiments 45-55, wherein the curable, coatable composition further comprises at least one solvent.

Embodiment 57 is the method of any of embodiments 45-56, further comprising contacting a nanostructured tool to the second major surface of the coating to impart a nanostructure to the second major surface of the optical coating layer prior to curing the optical coating layer.

Embodiment 58 is the method of any of embodiments 45-56, further comprising coating a curable low refractive index layer on the optical coating layer either prior to curing the optical coating layer or after curing the optical coating, and curing the curable low refractive index layer.

Embodiment 59 is the method of embodiment 58, further comprising coating an adhesive laminate article to the cured low refractive index layer, wherein the adhesive laminate article comprises an adhesive layer and a releasing substrate; and removing the first substrate.

Embodiment 60 is the method of any of embodiments 45-56, further comprising applying an adhesive laminate article to the cured optical coating layer, wherein the adhesive laminate article comprises an adhesive layer and a releasing substrate; and removing the first substrate.

EXAMPLES

Flexible optical coatings were made from (meth)acrylate monomers and nanoparticles. These examples are merely for illustrative purposes only and are not meant to be limiting on the scope of the appended claims. All parts, percentages, ratios, etc. in the examples and the rest of the specification are by weight, unless noted otherwise. Solvents and other reagents used were obtained from Sigma-Aldrich Chemical Company, St. Louis, Mo. unless otherwise noted.

| Table of Abbreviations | |
|---|---|
| Abbreviation | Description |
| N1 | Titanium dioxide nanoparticles available from Showa Denko Corp., Japan as NTB-1 (10 nm Titania) |
| S1 | Gamma-methacryloxypropyltrimethoxy silane, available from Momentive Performance Materials Inc. Waterford, NY as SILQUEST A-174NT |
| S2 | Polyalkyleneoxide alkoxysilane, available from Momentive Performance Materials Inc. Waterford, NY as SILQUEST A-1230 |
| M1 | Monomer, available from Miwon Specialty chemical Co. Ltd., Korea, as MIRAMER M1192, Refractive index 1.600 |
| M2 | Monomer, available from Sartomer-Arkema Group, Exton, PA as SR833, reported refractive index 1.500 |
| M3 | Monomer, available from Miwon Specialty chemical Co. Ltd., Korea, as MIRAMER HR6042, reported refractive index 1.600 |
| M4 | Monomer, available from Miwon Specialty chemical Co. Ltd., Korea, as MIRAMER HR6200, reported refractive index 1.530 |
| M5 | Monomer, available from Miwon Specialty chemical Co. Ltd., Korea, as MIRAMER HR6100, reported refractive index 1.562 |
| M6 | Monomer, available from IGM Resins, St. Charles, IL as PHOTOMER 6210, reported refractive index 1.490 |
| PH1 | Photoinitiator, Phosphine oxide, phenylbis(2,4,6-trimethylbenzoyl) available form BASF Florham Park, NJ, as IRGACURE 819 |
| PH2 | Photoinitiator, 2-Hydroxy-2-methyl-phenyl-1-propanone available form BASF Florham Park, NJ, as IRGACURE 1173 |
| PH3 | Photoinitiator, available form BASF Florham Park, NJ, as DAROCUR 4265 |
| FILM 1 | 5 mil thick unprimed Polyester film |
| FILM 2 | Polyester Film, 50 micron, available from TEKRA New Berlin WI., as MELINEX 453. |
| ADH 1 | 1 mil optically clear adhesive available from 3M Company as 8171 |
| COATING 1 | Low index coating as described in Example 4 of U.S. Pat. No. 8,012,567 |

Test Methods

Refractive Index

The refractive indices of the optical coatings were measured at 632.8 nm using a Metricon MODEL 2010 prism coupler (Metricon Corporation Inc. Pennington, N.J.). The optical coating to be measured was brought into contact with the base of a Rutile prism, leaving an air gap of the order of 0.1 μm. A light beam from a laser entered the prism and struck the base of the prism. The light was totally reflected at the prism base onto a photodetector. The total reflection left only evanescent fields in the air gap. Through these evanescent fields, the light wave from the prism was coupled into the waveguide. The prism, the sample, and the photodetector are mounted on a rotating table so that the incident angle of the laser beam can be changed correspondingly. Coupling was strongest when the following phase matching condition was satisfied.

$$\beta_m = \kappa_o n_p \sin(\theta_m)$$

Where $\beta_m$ is the propagation constant, $\kappa_o = \omega/c$, $n_p$ is the prism refractive index and m is the coupling angle.

At certain angles of incidence, sharp reflectivity dips occurred in the spectrum corresponding to the excitation of guided modes. This is known as the dark mode line spectrum and the dips are known as the 'dark' m-lines. At $\beta_m$, the light was coupled into the waveguide, resulting in a lack of reflected light at the base of the prism, consequently forming the dark mode line spectrum. From the positions of $\beta_m$, it was possible to determine the mode effective indices, the waveguide thickness, and the refractive index, n, of the waveguide.

Transmission, Haze and Clarity

Transmission haze and clarity were measured using the Haze-Gard Plus model 4725 (BYK Gardner, Columbia, Md.). All measurements were made in triplicate and the average reported. Transmission and haze were measured by placing the substrate on the haze port with the coated and cured sample facing the light source. With clarity measurements, the coated and cured material was placed on the clarity port and measured. The ASTM D 1003-13 test method for Haze and Luminous Transmittance of Transparent Plastics was used. % transmission, % haze, and % clarity values were recorded.

Flexibility—Bend Test

Elcometer 1506 cylindrical mandrel bend tester (Elcometer Inc. Rochester Hills, Mich.) was used to evaluate coating flexibility. Two types of bend tests were conducted; Tension and Compression. Compression with the cured coating facing the rod during the bend, and Tension bend with coating facing away from the rod. The diameter of the testing rods ranged from 2 mm to 30 mm. A strip of coated film about 2 inch width and approximately 5 inches in length was used for testing. The free ends were clamped into position and the bend lever was lifted/wrapped around the rod. After a total of twenty bends, the bent area was observed for visible cracking. The smallest rod diameter (mm) which passed (no visible cracking) was reported.

Spectrophotometric Color Measurements

Color measurements were made with a Spectro Guide Sphere Gloss #6834 available from BYK-Gardner USA. The instrument was calibrated as follows:
1. Press the measure button to turn on the spectro-guide.
2. Toggle right to 'option', down to 'calibrate', and right again to select the 'chk green' option (select with measure button).
3. Place the spectro-guide over the green reference for calibration and press the measure button. A message saying 'Calibration OK' will appear if the calibration was successful—measurements can now be taken.

Measurements were taken on a 2"×2" sample with coating side up place on black cloth. The Spectrophotometer was set to L, a*, b* recipe with "cut opening" on the sample. The measure button was pressed and the b* readings were recorded in the results table.

Titania Surface Modification 48.76 lbs. of N1 (10 nm Titania) was transferred into two 5-gallon pails with liner. Pail 1 had 26.41 lbs. of N1, and Pail 2 22.35 grams of N1; Amberlyst A23(OH), Ion Exchange Resin (Dow Chemical Company), was added to each pail at 5% weight of contents, 1.3 lbs and 1.12 lbs respectively. Both solutions were stirred for 20 minutes, at which time pH of solution elevated from 2.5 to approximately 4, as measured by pH paper. The treated solution was filtered with a mesh bag and obtained a final filtrate of weight 46.05 lbs. Solution was transferred into a 20-gallon kettle, and stirring was initiated; solution solids measured 15%. 74 lbs of 1-methoxy-2-propanol was added to filtrate in the kettle. The two modifiers (Si and S2) were added sequentially to kettle at 24.34% filtrate of solids weight, in an approximate ratio of 4:1 respectively. The kettle content was allowed to stir for 20 minutes after adding modifiers. The kettle jacket temperature was set to 82° C. and attained a batch temperature of 79° C. after nearly an hour. Material in kettle was left to react overnight (approximately 18 hours). The heat source to kettle was turned off after nearly 18 hours of reaction and allowed to cool to room temperature. Kettle content was stripped to eventually obtain less than 0.5% of moisture. This was done through a few additions of 1-methoxy-2-propanol to kettle and finally adding Methyl-Isobutyl Ketone and Methyl Ethyl Ketone. Final solution solids of the kettle were 39.29%. This solution was filtered through a 1 micron filter; the solution weighed 14.51 lbs. This produced Treated N1 Nanoparticle Solution.

Backfill Formulation

The various monomers were paired as shown in Table 1 below.

TABLE 1

Formulations

| Example | Nanoparticle Solution | Resin Mixture | Photoinitiator |
|---|---|---|---|
| E1 | 70% Treated N1 | 30% 3:1 M5/M1 | 2.5% 1:1 PH1/PH2 |
| E2 | 70% Treated N1 | 30% 3:1 M4/M1 | 2.5% 1:1 PH1/PH2 |
| E3 | 70% Treated N1 | 30% 1:3 M6/M1 | 2.5% 1:1 PH1/PH2 |
| E4 | 64% Treated N1 | 36% 1:1 M5/M1 | 2.5% 1:1 PH1/PH2 |
| E5 | 64% Treated N1 | 36% 1:1 M5/M1 | 1.5% PH3 |
| E6 | 70% Treated N1 | 30% 3:1 M5/M1 | 2.5% 1:1 PH1/PH2 |
| E7 | 70% Treated N1 | 30% 1:3 M6/M1 | 2.5% 1:1 PH1/PH2 |
| E8 | 64% Treated N1 | 36% 1:1 M5/M1 | 2.5% 1:1 PH1/PH2 |
| C1 | 70% Treated N1 | 30% 3:1 M3/M2 | 2.5% 1:1 PH1/PH2 |

Mixing Formulation Examples E1-E4

Each formulation weighed 100 grams with a target formulation solids of 41 wt %. The formulations comprise Treated N1 Nanoparticle Solution and associated Resin Mixture. The mixtures also contain a dual photoinitiator at 1:1 ratio, with a loading of 2.5% by weight of Resin Mixture.

70% Treated N1 Nanoparticle Solution at 39.29% solids with 30% Resin Mixture Into respective 150 ml amber bottles the following were added
  i) approximately 0.15 g each of PH1 and PH2
  ii) approximately 7.23 g each of Methyl-Isobutyl Ketone (MIBK) and Methyl Ethyl Ketone (MEK)
  iii) approximately 12.3 g of Resin Mixture (as noted in Table 1)
  iv) approximately 73.2 g of Treated N1 Nanoparticle Solution 64% Treated N1 Nanoparticle Solution at 39.29% solids with 36% Resin Mixture Into respective 150 ml amber bottles the following were added
  i) approximately 0.16 g each of PH1 and PH2
  ii) approximately 8.75 g each of MIBK and MEK
  iii) approximately 14.90 g of Resin Mixture (as noted in Table 1)
  iv) approximately 67.25 g of Treated N1 Nanoparticle Solution Single Layer Examples E1-E4 and C1

The solutions were coated onto the unprimed side of FILM 1 using a slot die. The coating was cured by passing through a Fusion H bulb UVA chamber with a dose of 1495 mJ/cm$^2$. The approximate thickness of the coatings was 2.5 microns. ADH1 was laminated to the treated side of FILM 2 and the open face adhesive side of this stack was laminated to the coated side of FILM 1. FILM 1 was then removed exposing the high index coated surface. Transmission, haze, clarity, refractive index, and coating flexibility were measured using the test method listed above for each Example and are shown in Table 2. Note that Refractive Index measurements were made on the FILM 1 coated sample.

Results Table 2 Single Layer Coatings

| Example | % Transmission | % Haze | % Clarity | Refractive Index | Mandrel Radius (mm) Tension | b* |
|---|---|---|---|---|---|---|
| E1 | 88.7 | 2.40 | 99.7 | 1.8023 | 8 | −2.51 |
| E2 | 88.8 | 2.46 | 99.7 | 1.7933 | 8 | −2.5 |
| E3 | 88.8 | 2.65 | 99.7 | 1.8059 | 8 | −2.79 |
| E4 | 88.9 | 2.51 | 99.7 | 1.7888 | 6 | −2.66 |
| C1 | na | na | na | na | na | na |

C1 coating cracked when FILM 1 was removed, no measurements could be taken.

Dual Layer Examples (E5-E8)

Examples were made with a high index structured layer that was planarized with a low index layer. The properties of these dual layer Examples were evaluated after environmental conditioning.

Formulations for solutions in E6, E7 and E8 weighed 1200 grams with a target formulation solids of 41%. The formulation for ES weighed 500 grams with a target formulation solids of 41%. The solids comprise Treated N1 Nanoparticle Solution and associated Resin Mixture. The mixtures also contain a dual photoinitiator at 1:1 ratio, with a loading of 2.5% by weight of Resin Mixture. Formulation for ES had a 1.5% photoinitiator loading.

Into respective 1.5L plastic bottles the following were added Formulation

70% Treated N1 Nanoparticle Solution at 39.29% solids with 30% Resin Mixture (1200 grams)

i) approximately 1.86 g each of PH1 and PH2
ii) approximately 92.55 g each of MIBK and MEK
iii) approximately 147.95 g Resin Mixture (as noted in Table 1)
iv) approximately 858.27 g of Treated N1 Nanoparticle Solution 64% Treated N1 Nanoparticle Solution at 39.29% solids with 36% Resin Mixture (1200 grams)
i) approximately 1.86 g each of PH1 and PH2
ii) approximately 92.55 g each of MIBK and MEK
iii) approximately 147.95 g Resin Mixture (as noted in Table 1)
iv) approximately 858.27 g of Treated N1 Nanoparticle Solution 64% Treated N1 Nanoparticle Solution at 39.29% solids with 36% Resin Mixture (500 grams)
i) approximately 1.11 g each of PH3 (1.5%)
ii) approximately 45.50 g each of MIBK and MEK
iii) approximately 74.23 g Resin Mixture (as noted in Table 1)
iv) approximately 327.20 g of Treated N1 Nanoparticle Solution Each solution was coated onto the unprimed side of FILM 1 with a slot die. A structured film tool with pitches ranging from 500 nm to 600 nm with a height of 300 nm was laminated onto the coating. (Structured film tool as described in U.S. Pat. No. 8,659,221. Tool A with periods of the 1:1 triangular pitches chosen to be 500 nm and 600 nm. This tool was used to create the PET based structured film tool). The coating was cured by passing through a Fusion H bulb UV chamber with a dose of 1495 mJ/cm$^2$. The approximate thickness of the coatings was 2.5 microns. The structured film tool was removed. COATING 1 was applied with a slot die to planarize the structured surface. This coating was cured by passing through a Fusion H bulb UV chamber with a dose of 1495 mJ/cm$^2$. The approximate thickness of the coating was 5 microns. ADH1 was laminated to the treated side of FILM 2 and the open face adhesive side of this stack was laminated to the coated side (COATING 1) of FILM 1. FILM 1 was then removed exposing the high index coated surface.

The Example constructions were subjected to humidity-90%/temperature-65C (aging) chamber for a week.
The following measurements were taken before (0) and after (1) one week's aging:
Transmission, haze, clarity, color and coating flexibility were measured, using the test methods listed above for each Example and are shown in Table 3.

TABLE 3

Results Dual Layer Coatings

| Example | Time weeks | % Transmission | % Haze | % Clarity | b* | Mandrel Radius (mm) Tension |
|---|---|---|---|---|---|---|
| E6 | 0 | 88.9 | 7.45 | 99.6 | −2.57 | 2 |
| E6 | 1 | 89.1 | 10.6 | 98.8 | −3.49 | 8 |
| E7 | 0 | 88.1 | 9.11 | 99.6 | −2.92 | 4 |
| E7 | 1 | 88.5 | 12.1 | 99.3 | −2.71 | N/A |
| E8 | 0 | 89.2 | 7.32 | 99.5 | −2.81 | 2 |
| E8 | 1 | 89.3 | 9.39 | 99.5 | −2.47 | 4 |
| E5 | 0 | 89.2 | 7.36 | 99.5 | −2.36 | 2 |
| E5 | 1 | 89.1 | 9.45 | 99.5 | −2.69 | 3 |

What is claimed is:
1. A curable, coatable composition comprising:
surface-treated inorganic nanoparticles with a high refractive index of at least 2.0, wherein the surface-treated inorganic nanoparticles have been treated with a surface treatment agent comprising a silane surface treatment agent; and
a curable reaction mixture, wherein the curable reaction mixture comprises:
a first (meth)acrylate monomer comprising a high refractive index (meth)acrylate monomer with a refractive index of 1.6 or higher;
a second (meth)acrylate monomer comprising a lower refractive index (meth)acrylate monomer with a refractive index of less than 1.6; and
at least one initiator, wherein the first (meth)acrylate monomer comprises a compound of Formula I:

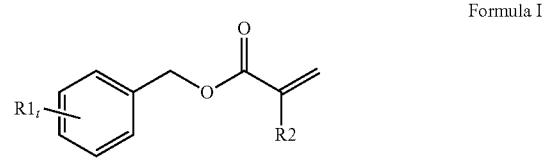

Formula I wherein at least one R1 comprises an aromatic substituent;
t is an integer from 1 to 4;
and R2 is hydrogen or methyl, and wherein R1 comprises:
a substituted or unsubstituted aromatic group of —CH$_2$—Ar, or
a heteroatom linked aromatic group of —X—Ar, where X is S or O, and
each Ar is independently a substituted or unsubstituted phenyl group, a fused aromatic group, or 2 or more alkyl group-linked phenyl or substituted phenyl groups.
2. The curable, coatable composition of claim 1, wherein the curable, coatable composition is capable of being coated and cured on a substrate to prepare a coating which is optically clear, having a visible light transmission of at least 88% and a haze of 5% or less, and has a refractive index of at least 1.78, and wherein the coating is capable of passing a 10 millimeter mandrel flexibility test.
3. The curable, coatable composition of claim 1, wherein the at least one R1 group comprises:

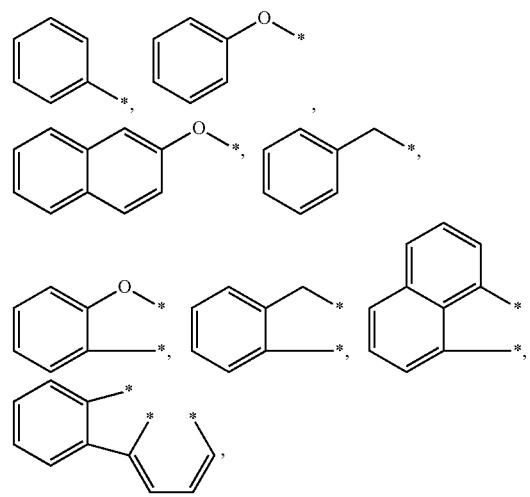

-continued

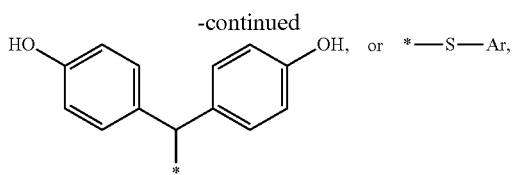

where each * denotes the point(s) of attachment to the aromatic ring of Formula I; and
Ar is a substituted or unsubstituted phenyl group, a fused aromatic group, or 2 or more alkyl group-linked phenyl or substituted phenyl or substituted phenyl groups.

4. The curable, coatable composition of claim 1, wherein the second (meth)acrylate monomer comprising a lower refractive index (meth)acrylate monomer with a refractive index of less than 1.6 comprises a (meth)acrylate monomer with at least one alkylene oxide linking group or a urethane (meth)acrylate monomer.

5. The curable, coatable composition of claim 4, wherein the (meth)acrylate monomer with at least one alkylene oxide linking group comprises a compound of Formula II:

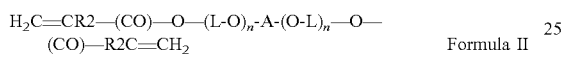

Formula II wherein R2 is hydrogen or methyl;
(CO) is a carbonyl group C=O;
A is divalent group comprising an aromatic or fused aromatic group;
the group $(O-L)_n$, represents a polyoxylkylene group comprising repeating —O-L- units, where L is a divalent alkylene group; and
n is an integer of 10 or greater.

6. The curable, coatable composition of claim 5,
wherein A is a fused aromatic group comprising a naphthyl group or a fluorenyl group;
L comprises an ethylene or propylene group; and
n is 10 or 20.

7. The curable, coatable composition of claim 1, wherein the inorganic nanoparticles with a high refractive index comprise metal oxide nanoparticles selected from zirconia nanoparticles or titania nanoparticles.

8. The curable, coatable composition of claim 1, wherein the inorganic nanoparticles comprise at least 64% by weight of the coatable composition based upon the total solid weight curable, coatable composition.

9. The curable, coatable composition of claim 1, wherein the curable, coatable composition further comprises at least one solvent.

10. An article comprising:
a first substrate with a first major surface and a second major surface; and
a cured or curable optical coating layer adjacent to at least a portion of the second major surface of the first substrate, wherein the cured or curable optical coating layer is prepared from a curable, coatable composition that has been coated and optionally cured, wherein the curable, coatable composition comprises:
surface-treated inorganic nanoparticles with a high refractive index, wherein the surface-treated inorganic nanoparticles have been treated with a surface treatment agent comprising a silane surface treatment agent; and
a curable reaction mixture, wherein the curable reaction mixture comprises:

a first (meth)acrylate monomer comprising a high refractive index (meth)acrylate monomer with a refractive index of 1.6 or higher;
a second (meth)acrylate monomer comprising a lower refractive index (meth)acrylate monomer with a refractive index of less than 1.6; and
at least one initiator, wherein the first (meth)acrylate monomer comprises a compound of Formula I:

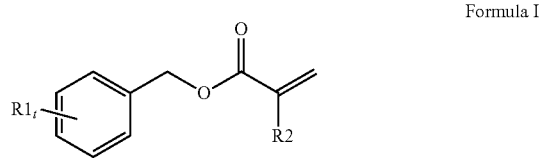

Formula I wherein at least one R1 comprises an aromatic substituent;
t is an integer from 1 to 4;
and R2 is hydrogen or methyl, and wherein R1 comprises:
a substituted or unsubstituted aromatic group of —CH$_2$—Ar, or
a heteroatom linked aromatic group of -X—Ar, where X is S or O, and
each Ar is independently a substituted or unsubstituted phenyl group, a fused aromatic group, or 2 or more alkyl group-linked phenyl or substituted phenyl groups.

11. The article of claim 10, further comprising an adhesive layer between the second major surface of the first substrate and the cured or curable optical coating layer.

12. The article of claim 10, further comprising a low refractive index layer with a refractive index of 1.55 or lower, in contact with the cured or curable optical coating layer such that an interface is formed between the cured or curable optical coating layer and the low refractive index layer.

13. The article of claim 12, wherein the interface between the cured or curable optical coating layer and the low refractive index layer comprises a nanostructured surface interface.

14. A device comprising a multilayer optical article, wherein the device comprises a device surface with a multilayer optical article attached to the device surface, wherein the multilayer optical article comprises:
an adhesive layer in contact with the device surface; and
a cured optical coating layer contacting the adhesive layer, wherein the cured optical coating layer is prepared from a curable, coatable composition that has been coated and cured, wherein the curable, coatable composition comprises:
surface-treated inorganic nanoparticles with a high refractive index, wherein the surface-treated inorganic nanoparticles have been treated with a surface treatment agent comprising a silane surface treatment agent; and
a curable reaction mixture, wherein the curable reaction mixture comprises:
a first (meth)acrylate monomer comprising a high refractive index (meth)acrylate monomer with a refractive index of 1.6 or higher;
a second (meth)acrylate monomer comprising a lower refractive index (meth)acrylate monomer with a refractive index of less than 1.6; and at least one initiator; wherein the first (meth)acrylate monomer comprises a compound of Formula I:

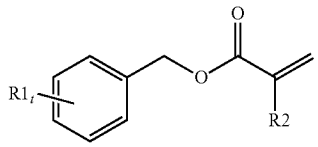

Formula I wherein at least one R1 comprises an aromatic substituent;
t is an integer from 1 to 4;
and R2 is hydrogen or methyl, and wherein R1 comprises:
a substituted or unsubstituted aromatic group of —$CH_2$—Ar;
or a heteroatom linked aromatic group of -X—Ar, where X is S or O, and
each Ar is independently a substituted or unsubstituted phenyl group, a fused aromatic group, or 2 or more alkyl group-linked phenyl or substituted phenyl groups; and
wherein the cured optical coating layer is optically clear, having a visible light transmission of at least 88% and a haze of 5% or less, and has a refractive index of at least 1.78, and is capable of passing a 10 millimeter mandrel flexibility test.

15. The device of claim 14, further comprising a low refractive index layer with a refractive index of 1.55 or lower, in contact with the cured optical coating layer such that an interface is formed between the cured optical coating layer and the low refractive index layer.

16. The device of claim 15, wherein the interface between the cured optical coating layer and the low refractive index layer comprises a nanostructured interface.

17. The device of claim 15, further comprising at least one additional layer in contact with the low refractive index layer, wherein the at least one additional layer comprises an adhesive layer, an organic layer, or an inorganic layer.

18. The device of claim 14, wherein the device surface comprises the surface of an OLED (Organic Light Emitting Diode) device.

19. A method of preparing an optical article comprising:
providing a first substrate with a first major surface and a second major surface;
providing a curable, coatable composition comprising:
surface-treated inorganic nanoparticles with a high refractive index, wherein the surface-treated inorganic nanoparticles have been treated with a surface treatment agent comprising a silane surface treatment agent; and
a curable reaction mixture, wherein the curable reaction mixture comprises:
a first (meth)acrylate monomer comprising a high refractive index (meth)acrylate monomer with a refractive index of 1.6 or higher;
a second (meth)acrylate monomer comprising a lower refractive index (meth)acrylate monomer with a refractive index of less than 1.6; and
at least one initiator; wherein the first (meth)acrylate monomer comprises a compound of Formula I:

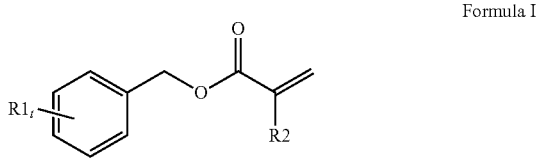

Formula I wherein at least one R1 comprises an aromatic substituent;
t is an integer from 1 to 4;
and R2 is hydrogen or methyl, and wherein R1 comprises:
a substituted or unsubstituted aromatic group of —$CH_2$—Ar, or
a heteroatom linked aromatic group of -X—Ar, Where X is S or O,
and each Ar is independently a substituted or unsubstituted phenyl group, a fused aromatic group, or 2 or more alkyl group-linked phenyl or substituted phenyl groups;
coating the curable, coatable composition on at least a portion of the second major surface of the first substrate to form an optical coating layer adjacent to the second major surface of the first substrate; and
curing the optical coating layer.

20. The method of claim 19, further comprising contacting a microstructured tool to the second major surface of the coating to impart a microstructure to the second major surface of the optical coating layer prior to curing the optical coating layer.

* * * * *

UNITED STATES PATENT AND TRADEMARK OFFICE
CERTIFICATE OF CORRECTION

PATENT NO. : 11,034,843 B2
APPLICATION NO. : 16/473910
DATED : June 15, 2021
INVENTOR(S) : Claire Hartmann-Thompson It is certified that error appears in the above-identified patent and that said Letters Patent is hereby corrected as shown below:

In the Claims

Column 39
Line 13 (approx.), In Claim 3, delete "or substituted phenyl or substituted phenyl groups" and insert -- or substituted phenyl groups --, therefor.
Line 31 (approx.), In Claim 5, delete "group (O-L)$_n$, represents" and insert -- group (O-L)$_n$ represents --, therefor.

Signed and Sealed this
Fourteenth Day of November, 2023

*Katherine Kelly Vidal*
Katherine Kelly Vidal
*Director of the United States Patent and Trademark Office*